(12) United States Patent
Niu et al.

(10) Patent No.: US 10,908,993 B2
(45) Date of Patent: Feb. 2, 2021

(54) METHOD TO DELIVER IN-DRAM ECC INFORMATION THROUGH DDR BUS

(71) Applicant: Samsung Electronics Co., Ltd., Suwon-si (KR)

(72) Inventors: Dimin Niu, Sunnyvale, CA (US); Mu-Tien Chang, San Jose, CA (US); Hongzhong Zheng, Sunnyvale, CA (US); Hyun-Joong Kim, Hwasung-si (KR); Won-Hyung Song, Osan-Si (KR); Jangseok Choi, Hwasung-Si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/411,122

(22) Filed: May 13, 2019

(65) Prior Publication Data
US 2019/0266049 A1 Aug. 29, 2019

Related U.S. Application Data

(62) Division of application No. 15/410,752, filed on Jan. 19, 2017, now Pat. No. 10,394,648.

(60) Provisional application No. 62/418,779, filed on Nov. 7, 2016.

(51) Int. Cl.
G06F 11/10 (2006.01)
G11C 29/52 (2006.01)
G11C 11/4093 (2006.01)

(52) U.S. Cl.
CPC ...... *G06F 11/1068* (2013.01); *G06F 11/1048* (2013.01); *G11C 11/4093* (2013.01); *G11C 29/52* (2013.01)

(58) Field of Classification Search
CPC ............. G06F 11/1068; G06F 11/1048; G11C 11/4093; G11C 29/52
See application file for complete search history.

(56) References Cited

U.S. PATENT DOCUMENTS

| | | | |
|---|---|---|---|
| 5,381,540 A | 1/1995 | Adams et al. |
| 5,864,568 A | 1/1999 | Nemazie |
| 5,875,195 A | 2/1999 | Dixon |
| 8,255,783 B2 | 8/2012 | Kim |
| 8,862,953 B2 | 10/2014 | Gollub et al. |
| 9,037,949 B1 | 5/2015 | Vogelsang et al. |

(Continued)

OTHER PUBLICATIONS

Final Office Action for U.S. Appl. No. 15/410,752, dated Dec. 12, 2018.

(Continued)

*Primary Examiner* — Kyle Vallecillo
(74) *Attorney, Agent, or Firm* — Renaissance IP Law Group LLP

(57) ABSTRACT

A memory controller is disclosed. The memory controller may include read circuitry to request a value at an address stored in a plurality of data chips, parity circuitry to calculate a parity from original data received from the plurality of the data chips, pollution pattern analysis circuitry to compare the parity with a plurality of pollution patterns programmed into the plurality of the data chips to identify a data chip with an error, and error correction circuitry to correct the error in the original data received from the identified data chip with the error.

21 Claims, 19 Drawing Sheets

(56) References Cited

U.S. PATENT DOCUMENTS

| | | | |
|---|---|---|---|
| 9,348,693 B2 | 5/2016 | Cheng et al. | |
| 9,646,661 B2 | 5/2017 | McClain | |
| 10,552,252 B2* | 2/2020 | Seokhun | G06F 3/0679 |
| 2002/0144210 A1* | 10/2002 | Borkenhagen | G11C 7/24 |
| | | | 714/805 |
| 2003/0101405 A1* | 5/2003 | Shibata | H03M 13/152 |
| | | | 714/763 |
| 2004/0073838 A1 | 4/2004 | Tabe | |
| 2006/0171202 A1 | 8/2006 | Kawamoto et al. | |
| 2009/0150646 A1 | 6/2009 | Allen et al. | |
| 2012/0198309 A1* | 8/2012 | Alves | G06F 11/10 |
| | | | 714/763 |
| 2014/0177375 A1 | 6/2014 | McClain | |
| 2014/0258795 A1* | 9/2014 | Schnizler | H04L 1/244 |
| | | | 714/705 |
| 2017/0132074 A1* | 5/2017 | Zhang | G11C 29/52 |
| 2018/0060161 A1* | 3/2018 | Seokhun | G06F 3/0619 |

OTHER PUBLICATIONS

Notice of Allowance for U.S. Appl. No. 15/410,752, dated Apr. 17, 2019.
Office Action for U.S. Appl. No. 15/410,752, dated Jul. 19, 2018.
Notice of Allowance for U.S. Appl. No. 16/411,127, dated May 28, 2020.
Corrected Notice of Allowability for U.S. Appl. No. 16/411,127, dated Jun. 19, 2020.
Corrected Notice of Allowability for U.S. Appl. No. 16/411,127, dated Sep. 10, 2020.

* cited by examiner

METHOD TO DELIVER IN-DRAM ECC INFORMATION THROUGH DDR BUS

RELATED APPLICATION DATA

This application is a divisional of U.S. patent application Ser. No. 15/410,752, filed Jan. 19, 2017, which claims the benefit of U.S. Provisional Patent Application Ser. No. 62/418,779, filed Nov. 7, 2016, both of which are incorporated by reference herein for all purposes.

This application is related to U.S. patent application Ser. No. 16/411,127, filed May 13, 2019, which is a divisional of U.S. patent application Ser. No. 15/410,752, filed Jan. 19, 2017, which claims the benefit of U.S. Provisional Patent Application Ser. No. 62/418,779, filed Nov. 7, 2016, all of which are incorporated by reference for all purposes.

FIELD

The inventive concepts relate generally to memory, and more particularly to providing error correcting capabilities without increasing the number of data chips in a memory module.

BACKGROUND

In the future, memory modules may require in-Dynamic Random Access Memory (DRAM) error correction. Combined with the use of narrow channels, the overhead required for error correction may be increasing. For example, transitioning from wide channels to narrow channels may double the error correction overhead. Satisfying the reliability, availability, and serviceability (RAS) requirements for memory may become expensive. But discarding error correction capability entirely may reduce the usability of the memory module.

A need remains for a way for to provide error correction capability in a memory module without increasing the overhead requirements for error correction.

DETAILED DESCRIPTION

Figure 1:
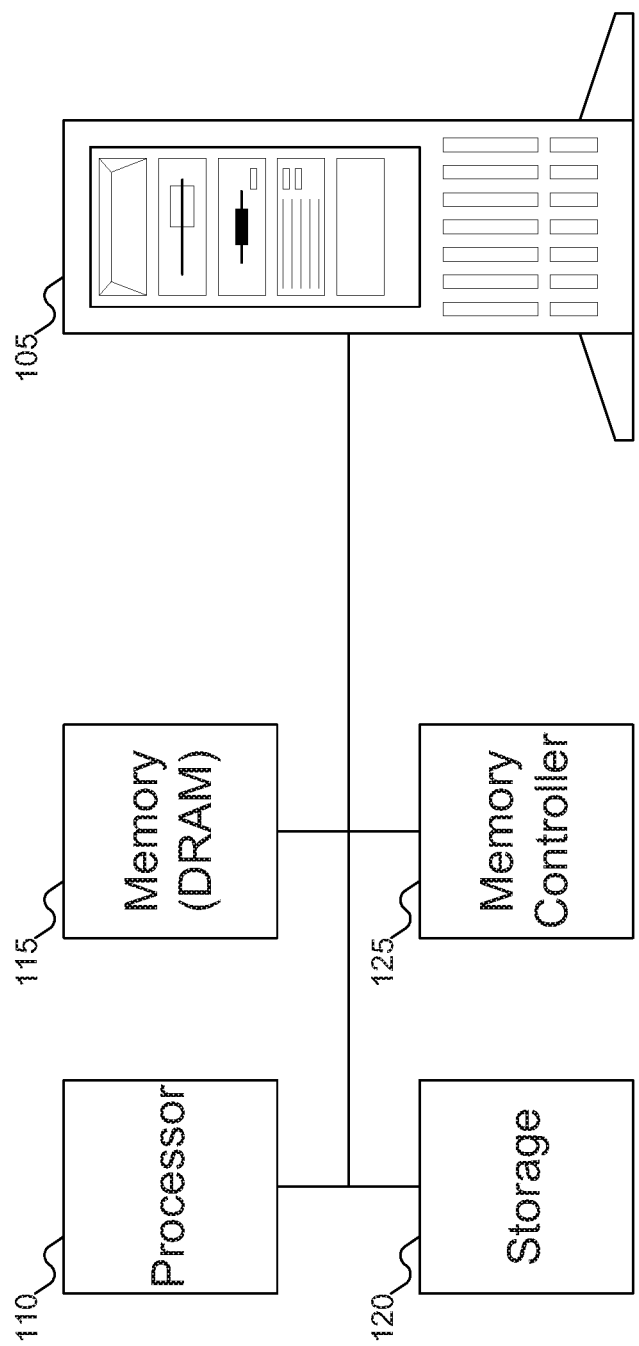
FIG. 1 shows a machine with a memory and memory controller, according to an embodiment of the inventive concept.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the inventive concept may reduce the Error Correcting Code (ECC) overheads of Dynamic Random Access Memory (DRAM) modules. Embodiments of the inventive concept may be used with current Dual Data Rate (DDR)-4 64 bit channels and future narrow (32 bits) DDR channels. Embodiments of the inventive concept may support any DRAM type, including ×4 (4 bit data width DRAM), ×8, ×16, or any other burst size. Embodiments of the inventive concept may also support memory modules that may support any number of bursts in a memory transaction, including 8 burst (8 bursts per data chip per memory transaction), 16 burst, or any other number of bursts per memory transaction.

Future DRAM devices may use a narrower channel (32 bits, as opposed to 64 bits) to maintain increasing throughput. There may be a corresponding increase in the internal prefetch (16n vs. 8n) and external burst length (16n vs. 8n) as well.

But these changes may make it difficult to maintain current reliability, availability, and serviceability (RAS) features with a similar overhead to current Dynamin Random Access Memory (DRAM) Dual In-line Memory Module (DIMM) devices. For example, current DDR-4 Error Correcting Codes (ECC) DRAM DIMMs use16 data chips and 2 error correcting code (ECC) chips for each channel. To maintain the same ECC coverage, future narrow DRAM channel may require 2 ECC chips to protect only 8 data chips: continuing to use only 2 ECC chips to protect 16 data chips may result in downgraded ECC coverage.

In addition, future DRAM devices may use in-DRAM ECC to lower the bit error rate for DRAM devices. To deliver the in-DRAM ECC information from DRAM device to memory controller, a dedicated or shared pin(s) is required. Instead, a method and mechanism to deliver the in-DRAM ECC information may be implemented by injecting additional errors when an error is detected in DRAM devices. That is, the memory controller may program DRAM chips in the same channel with different pollution patterns during boot-up. Different DRAM chips in the same channel should have different pollution patterns. Pollution pattern selection may be different according to different chip set vendors. Pollution pattern selection may results in different error coverage.

Embodiments of the inventive concept may use only 1 ECC chip, plus in-DRAM ECC, to provide basic reliability, availability, and serviceability (RAS) protection. For example:

In a DDR-4 64 bit channel using ×4 chips, the memory module may include 16×4 data chips plus 1 ECC chip. Such an embodiment of the inventive concept may offer error correction at ½ the overhead of current error correction (which uses 16 data chips plus 2 ECC chips).

In a DDR-4 64 bit channel using ×8 chips, the memory module may include 8×8 data chips plus 1 ECC chip. Such an embodiment of the inventive concept may offer basic chip kill (one data chip failure), which current DDR-4×8 does not support.

In a DDR-4 64 bit channel using ×16 data chips, the memory module may include 4×16 data chips plus 1 ECC chip. Such an embodiment of the inventive concept may offer basic chip kill (one data chip failure), which current DDR-4×16 does not support.

For future 32 bit channel ×4 memory modules, the memory module may include 8×4 data chips plus 1 ECC chip. Such an embodiment of the inventive concept may offer error correction at ½ the overhead of current error correction.

In general, for future memory modules with N bits per channel, and ×4M data chips, the memory module may include N/4M×4M data chips plus 1×M ECC chip.

When an in-DRAM ECC mechanism detects an internally uncorrectable error, the DRAM pollutes the data with these stored patterns. The data pollution may be accomplished by XORing the data on the chip with the pollution pattern when an internally uncorrectable error occurs.

The pollution pattern may use either a coarse or a fine granularity. With a fine grained approach, each pattern has 64 bits in a bit-to-bit mapping. This provides for more flexible information delivery, but requires more bits (storage overhead) in the mask register, and is less reliable. At a coarse granularity, each chip is given a repeating, pre-defined pattern. The means the pollution patterns are fixed and inflexible, but require fewer bits (storage overhead) in the mask register and is more reliable.

The pollution pattern may be of any desired size. A recommended minimum pollution may be the size of one burst (although any pollution pattern size may be used so long as the memory controller may determine which data chip applied the pollution pattern). So, embodiments of the inventive concept may use 4 bit pollution patterns with ×4 data chips, 8 bit pollution patterns with ×8 data chips, 16 bit pollution patterns with ×16 data chips, and so on. The pollution pattern may be as large as a memory transaction (the number of bits in a single burst multiplied by the number of bursts in a memory transaction), which might vary from, for example, 32 bits (for 8 burst×4 data chips) to 256 bits (for 16 burst×16 chips), or even larger.

In addition, a pollution pattern may be larger than one memory transaction. But if the pollution pattern is larger than a single memory transaction, detecting the pollution pattern may require two or more memory transaction to happen consecutively, which may be inefficient in terms of performance.

Assuming the memory controller may detect the error, the memory controller may identify the error location (chip with the error) by using the pollution patterns. The memory controller may then use parity across chips to correct the error.

FIG. 1 shows a machine with a memory and memory controller, according to an embodiment of the inventive concept. In FIG. 1, machine 105 is shown. Machine 105 may be any desired machine, including without limitation a desktop or laptop computer, a server (either a standalone server or a rack server), or any other device that may benefit from embodiments of the inventive concept. Machine 105 may also include devices such as specialized portable computing devices, tablet computers, and even smartphones. And while the described embodiments of the inventive concept refer to DRAM modules, embodiments of the inventive concept may be applied to any form of memory that internally stores information across multiple chips (each of which may potentially be a separate source of failure).

Machine 105, regardless of its specific form, may include processor 110, memory 115, storage device 120, and memory controller 125. Processor 110 may be any variety of processor: for example, an Intel Xeon, Celeron, Itanium, or Atom processor, an AMD Opteron processor, an ARM processor, etc. While FIG. 1 shows a single processor, machine 105 may include any number of processors. Memory 115 may be any variety of memory, such as flash memory, Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM) etc. to which embodiments of the inventive concept are applicable, but is typically DRAM. Memory 115 may also be any desired combination of different memory types.

Storage device 120 may be any variety of storage device. Examples of such devices may include Solid State Drives (SSDs), but other storage forms, such as hard disk drives or other long-term storage devices, are also viable. In addition, memory 115 and storage device 120 may be combined: that is, embodiments of the inventive concept might not distinguish between the concepts of short-term and long-term storage, but manage both in a single form factor. Finally, memory controller 125 may manage communications between processor 110 and memory 115, requesting (and storing) information in memory 115 as appropriate. Memory controller 125 may integrated with processor 110 or in a separate chip.

Figure 2:
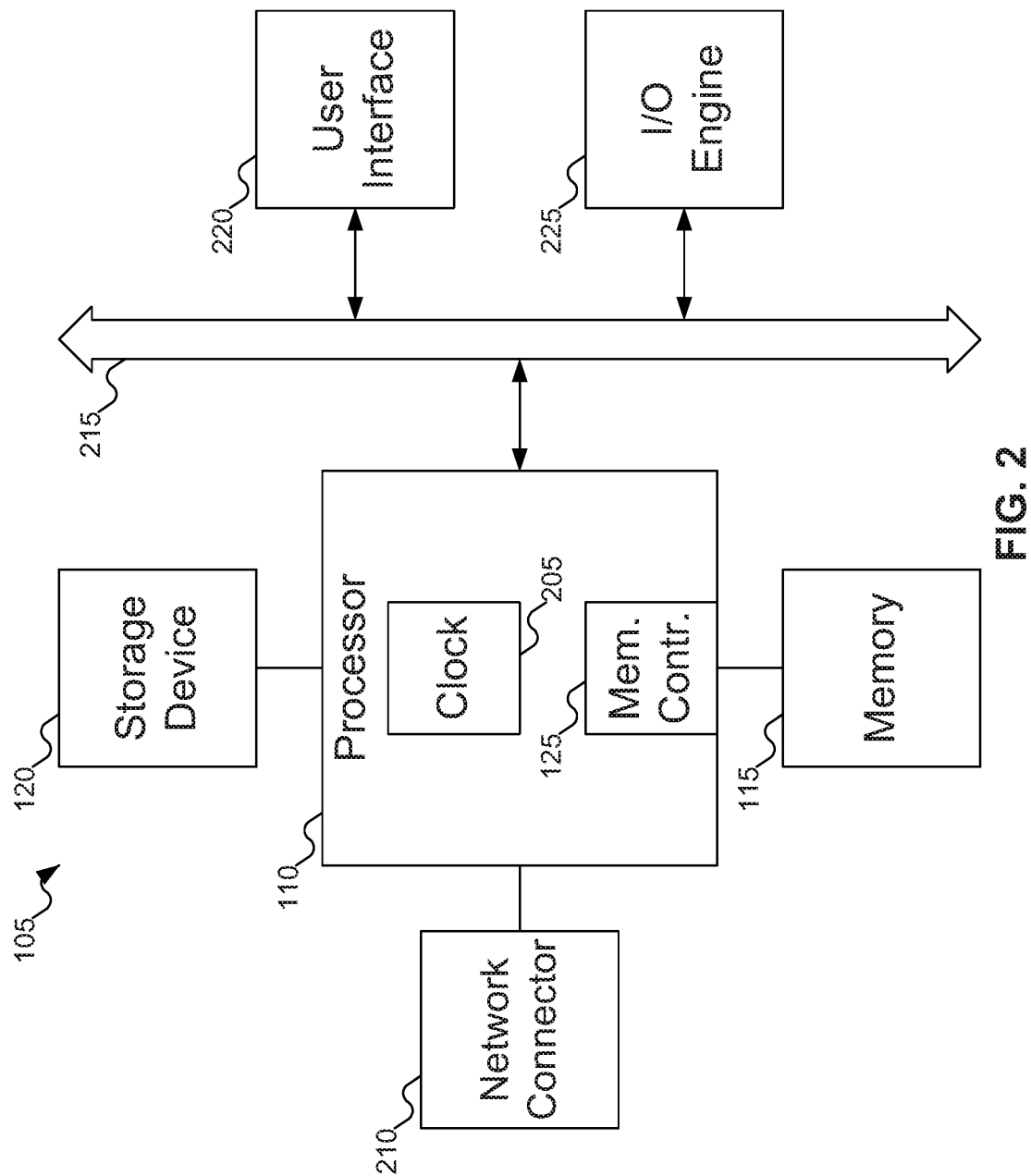
FIG. 2 shows additional details of the machine of FIG. 1.

FIG. 2 shows additional details of the machine of FIG. 1. Referring to FIG. 2, typically, machine 105 includes one or more processors 110, which may include memory controller 125 and clock 205, which may be used to coordinate the operations of the components of machine 105. Processors 110 may also be coupled to memory 115, which may include random access memory (RAM), read-only memory (ROM), or other state preserving media, as examples. Processors 110 may also be coupled to storage devices 120, and to network connector 210, which may be, for example, an Ethernet connector or a wireless connector. Processors 110 may also be connected to a bus 215, to which may be attached user interface 220 and input/output interface ports that may be managed using input/output engine 225, among other components.

Figure 3:
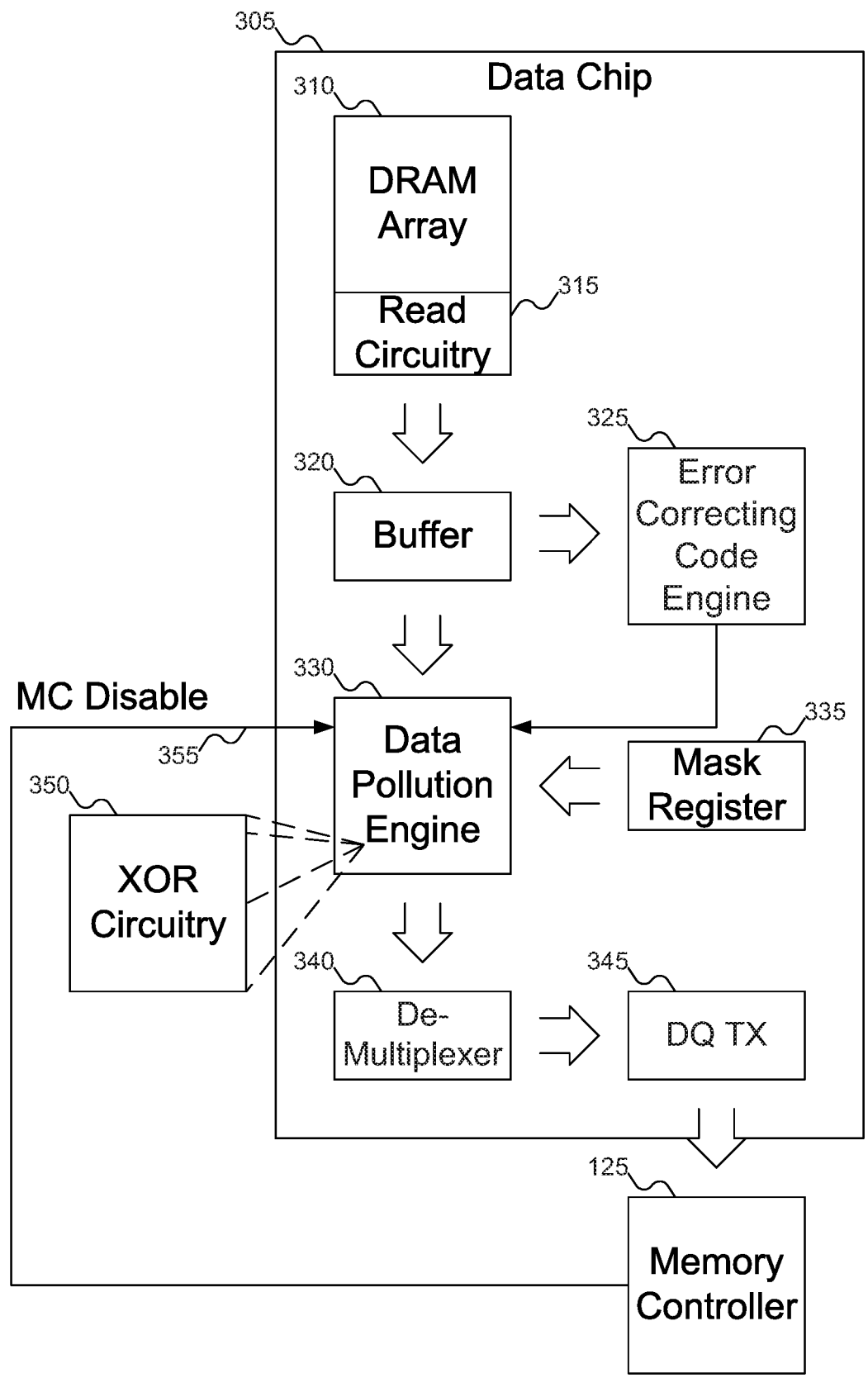
FIG. 3 shows details of a memory chip in the memory of FIG. 1.

FIG. 3 shows details of a memory chip in memory 115 of FIG. 1. In FIG. 3, data chip 305 (which may be one of a plurality of chips in memory 115) may include DRAM array 310, read circuitry 315, buffer 320, ECC engine 325, data pollution engine 330, mask register 335, demultiplexer 340, and transmission circuitry 345. DRAM array 310 may store data within data chip 305. Read circuitry 315 may read data from DRAM array 310. For example, read circuitry 315 may include sense amplifiers to read values from DRAM array 310. Buffer 320 may temporarily store the data read from DRAM array 310 by read circuitry 315, while data chip 305 does some processing. ECC engine 325 may attempt to perform error correction on the data in buffer 320, if possible. ECC engine 325 may provide results of its operation to data pollution engine 330, so that data pollution engine 330 knows whether or not it needs to operate.

Data pollution engine 330 may pollute the data from buffer 320 when needed. As described below with reference to FIG. 5, pollution involves modifying the data in buffer 320 based on a pollution pattern. Data pollution may be performed by XORing a pollution pattern with the data in buffer 320: for example, using XOR circuitry 350. Alternatively, data pollution may be performed by simply replacing the data in buffer 320 with the pollution pattern, regardless of what the error actually is. If the data in buffer 320 exactly matches the pollution pattern, this fact might result in the system incorrectly "detecting" a false error, but hopefully the system may recover from such a situation. The pollution pattern may be accessed from mask register 335. Data pollution engine 330, like any other engine or circuitry described herein, may be implemented in any desired manner. For example, the engines and circuitry may be implemented using custom circuitry that implements the desired functionality, or they may be implemented using an array such a Field Programmable Gate Array (FPGA) or equivalent technology.

Because there may be situations in which memory controller 125 might want the raw (unpolluted) data from buffer 320, memory controller 125 may send Memory Controller Disable signal 355 to data pollution engine 330. Thus, data pollution engine 330 may operate to pollute the data if ECC engine 325 indicates that there was an uncorrectable error, unless memory controller 125 has sent Memory Controller Disable signal 355.

The output of data pollution engine 330 may then be sent to demultiplexer 340, which may select the appropriate data to output to memory controller 125. Transmission circuitry 345 may then be used to send the selected data to memory controller 125.

Figure 4:
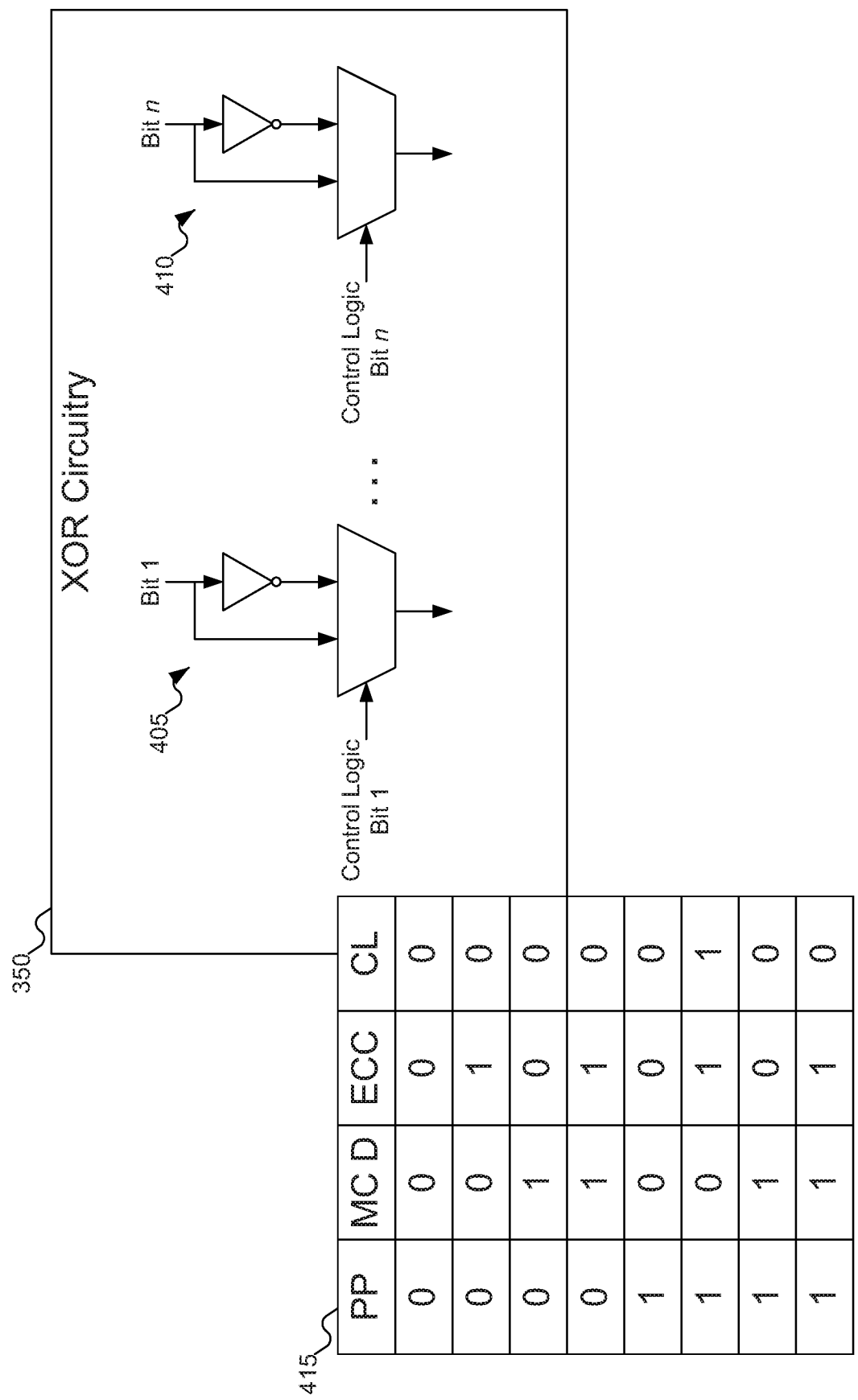
FIG. 4 shows an example implementation of the XOR circuitry of FIG. 3.

FIG. 4 shows an example implementation of XOR circuitry 350 of FIG. 3. In FIG. 4, XOR circuitry 350 may include logics 405 and 410, which may control whether the original input value of the bit or its reverse value is selected (using a signal splitter, a signal negation, and a multiplexer). Logics 405 and 410 may use control logic bits to determine what value to select.

As a general rule, the control logic will select the original value for the bit, unless ECC engine 325 of FIG. 3 is unable to correct the error and memory controller 125 of FIG. 1 has not sent Memory Controller Disable signal 355 of FIG. 3. Thus, in terms of a logic equation, the control logic (CL) may be thought of as the result of the pollution pattern (PP) from mask register 335 of FIG. 3 AND (not Memory Controller Disable signal 355 of FIG. 3) AND ECC engine 325 of FIG. 3. Table 415 shows the values the control logic may take, given different values for the pollution pattern, Memory Controller Disable signal 355 of FIG. 3, and ECC engine 325 of FIG. 3. But table 415 is merely illustrative, and given different inputs the control logic may be specified using other logic equations.

Figure 5:
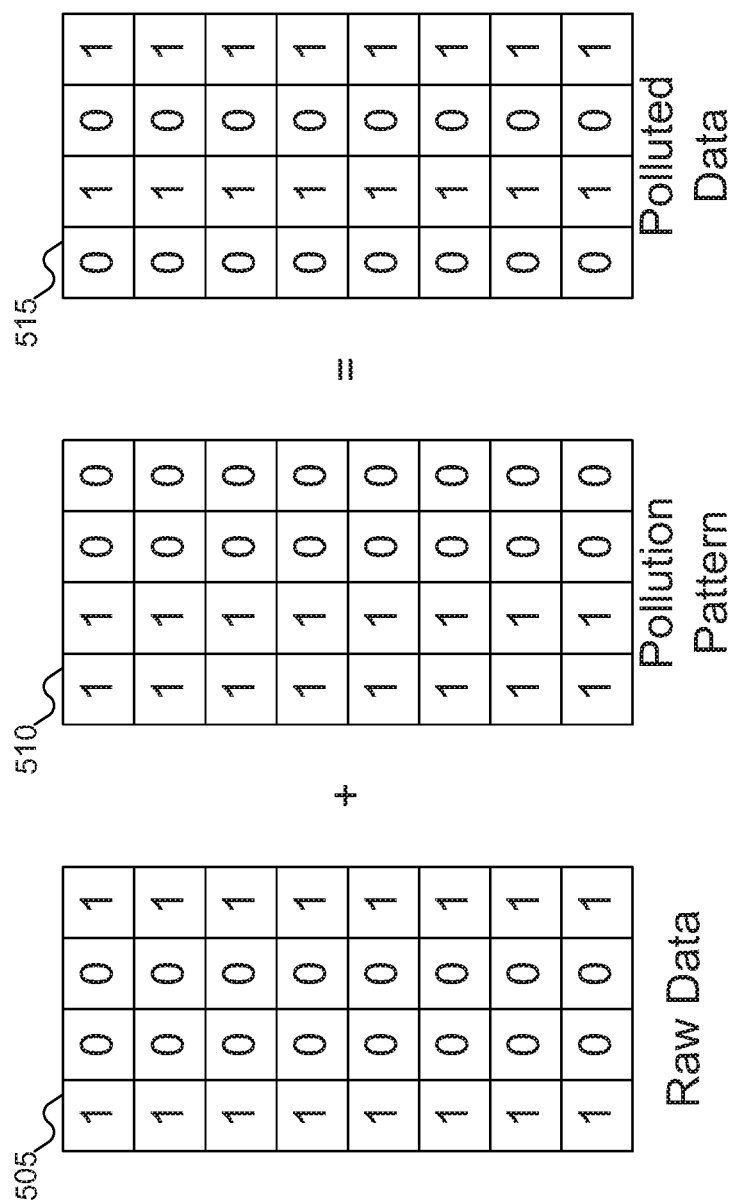
FIG. 5 shows how data in the data chip of FIG. 3 may be polluted.

FIG. 5 shows how data in data chip 305 of FIG. 3 may be polluted. In FIG. 5, the values stored in buffer 320 of FIG. 3 is shown as including 32 bits (although the width of buffer 320 of FIG. 3 may be any width: 32 bits is merely exemplary). For simplicity of representation, FIG. 5 shows the data arranged in two dimensions, although in practice buffer 320 of FIG. 3 may be one-dimensional. Raw data 505 may be XORed with pollution pattern 510, producing polluted data 515. Note that each bit in polluted data 515 is the XOR of the corresponding bits in raw data 505 and pollution pattern 510. But while FIG. 5 shows XORing raw data 505 with pollution pattern 510, embodiments of the inventive concept may support any desired approach to pollute raw data 505

Figure 6:
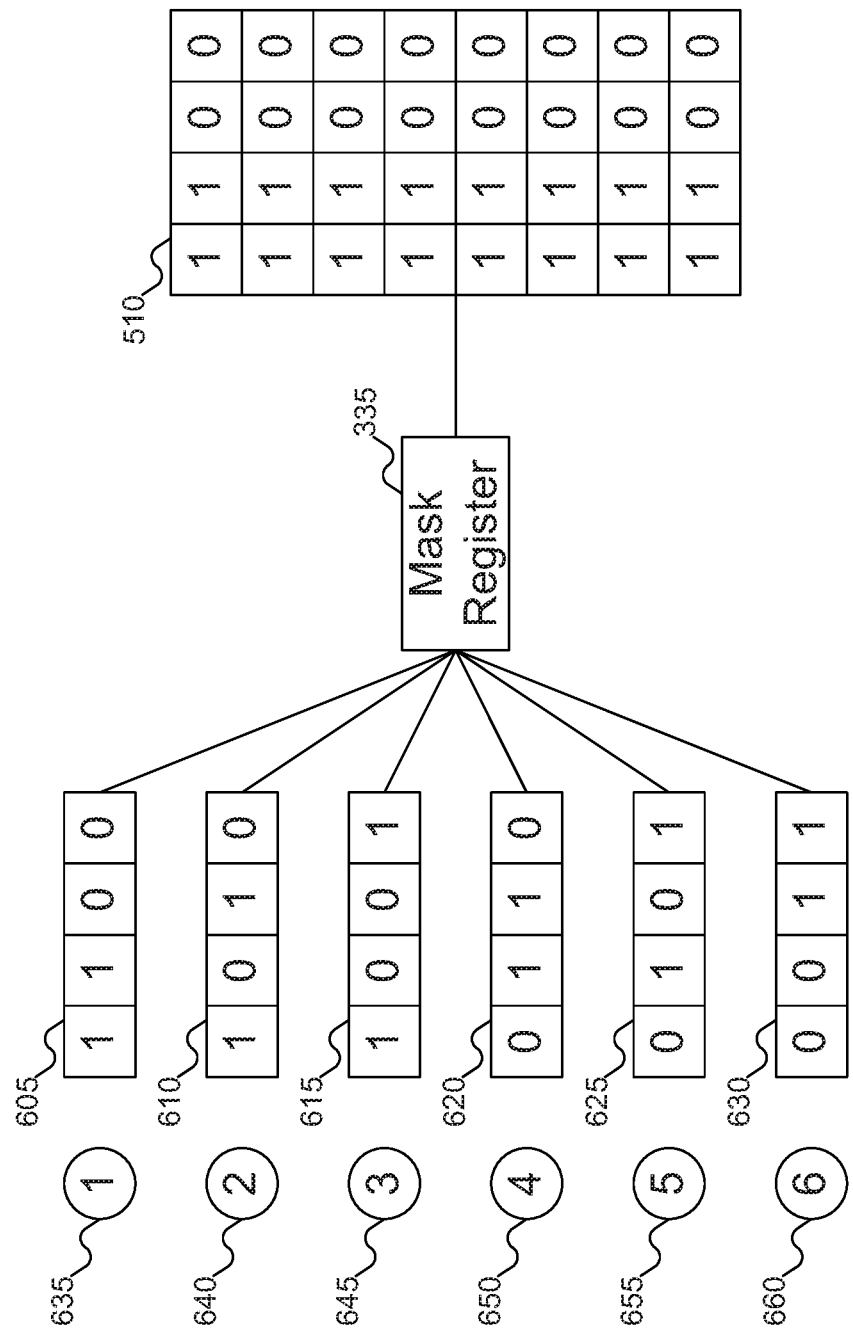
FIG. 6 shows a mask register in the data chip of FIG. 3 storing pollution patterns.

FIG. 6 shows mask register 335 of FIG. 3 in data chip 305 of FIG. 3 storing pollution patterns. In FIG. 6, mask register 335 may include pollution patterns, such as pollution pattern 510. In some embodiments of the inventive concept, memory controller 125 of FIG. 1 may program pollution pattern 510 into mask register 335 at boot up. As described above, by programming each data chip 305 of FIG. 3 (at least in the same data channel) with a different pollution pattern, memory controller 125 of FIG. 1 may then attempt to determine which data chip 305 of FIG. 3 is the data chip with an error that could not be corrected using in-chip ECC.

Alternatively, in other embodiments of the inventive concept, data chip 305 of FIG. 3 may be pre-programmed (e.g., by the manufacturer) with various pollution patterns. For example, mask register 335 may be pre-programmed with pollution patterns 605, 610, 615, 620, 625, and 630, among others. While FIG. 6 shows six pre-programmed pollution patterns, typically the number of pre-programmed pollution patterns will be at least as large as the number of data chips in the memory module (although fewer pollution patterns may be pre-programmed provided that each data chip in the same data channel may be assigned a unique pollution pattern). Memory controller 125 of FIG. 1 may then select a pollution pattern for the data chip to use from pre-programmed pollution patterns 605, 610, 615, 620, 625, and 630.

Each pre-programmed pollution pattern may be assigned an identifier. For example, pre-programmed pollution pattern 605 may be assigned identifier 635, pre-programmed pollution pattern 610 may be assigned identifier 640, and so on for identifiers 645, 650, 655, and 660. Memory controller 125 of FIG. 1 may then identify the pre-programmed pollution pattern to use simply by passing to data chip 305 of FIG. 3 the identifier of the selected pre-programmed pollution pattern.

Note that in FIG. 6, pollution pattern 510 is 32-bits long, whereas pollution patterns 605-630 are four bits long. In some embodiments of the inventive concept, pollution patterns (such as pollution pattern 510) that have the same width as buffer 320 of FIG. 3 may be used, whereas in other embodiments of the inventive concepts pollution patterns (such as pollution pattern 605) that have narrower widths than buffer 320 of FIG. 3 may be used, with the pattern repeated as often as necessary to establish a pollution pattern that covers the entirety of buffer 320 of FIG. 3. The advantage of using a fine granularity (full-width) pollution pattern is increased flexibility in establishing and using the pollution pattern; the disadvantage of a fine granularity pollution pattern is that mask register 335 of FIG. 3 would need to store more information, and the pollution pattern is potentially less reliable. The advantage of a coarse granularity (narrow-width) pollution pattern is that it is not as wide as buffer 320 of FIG. 3 and therefore requires fewer bits in mask register 335 of FIG. 3; a coarse granularity pollution patterns is also potentially more reliable. The disadvantage of a coarse granularity pollution pattern is that the pollution pattern is less flexible and the number of possible pollution patterns is limited.

Note that, ideally, the number of bits in common between any pair of pollution patterns used in the memory module should be no more than one half of the number bits in the pollution pattern. For example, if two pollution patterns are identical except for a value in a single bit, an error that affects that bit could leave memory controller 125 of FIG. 1 unable to determine which data chip had the error. Increasing the number of bits that differ between pollution patterns increases the likelihood that memory controller 125 of FIG. 1 may identify which data chip has the error. Thus, for any pair of pollution patterns 605, 610, 615, 620, 625, and 630, only two of the four bits are the same, keeping the pollution patterns as far apart as possible.

Figure 7:
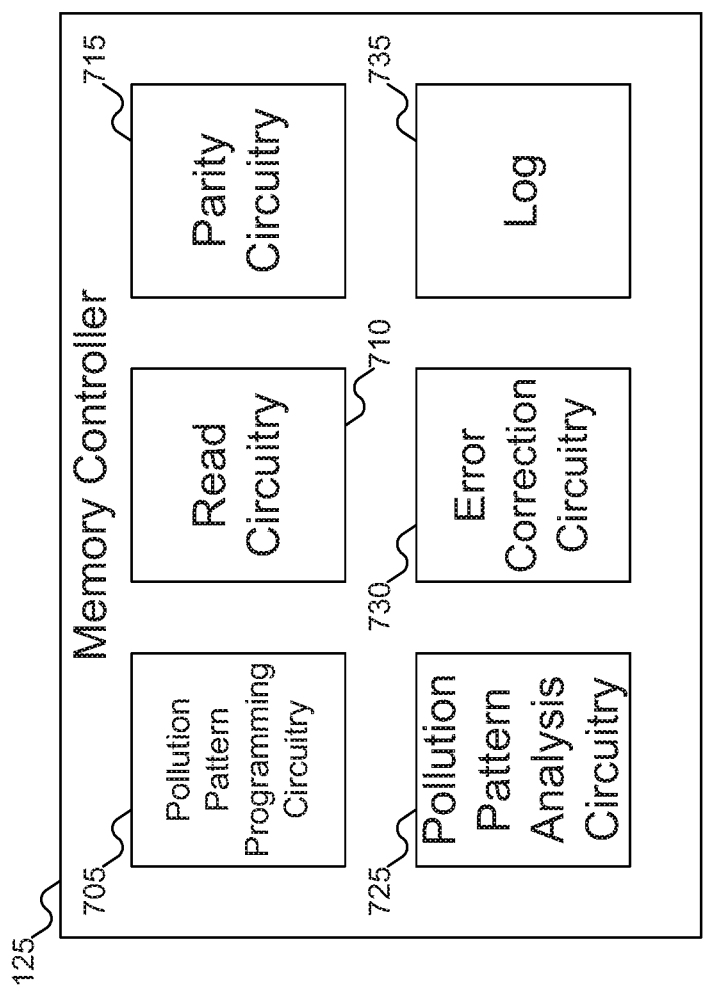
FIG. 7 shows details of the memory controller of FIG. 1.

FIG. 7 shows details of memory controller 125 of FIG. 1. In FIG. 7, memory controller 125 is shown as including pollution pattern programming circuitry 705, read circuitry 710, parity circuitry 715, pollution pattern determination circuitry 720, pollution pattern analysis circuitry 725, error correction logic 730, and log 735. Pollution pattern programming circuitry 705 may program a data chip, such as data chip 305 of FIG. 3, of memory module 115 of FIG. 1, with a pollution pattern. As described above with reference to FIG. 6, pollution pattern programming circuitry 705 may program a particular pollution pattern (of either fine granularity or coarse granularity) into data chip 305 of FIG. 3, or pollution pattern programming circuitry 705 may identify a pre-programmed pollution pattern (again, of either fine granularity or coarse granularity) for data chip 305 of FIG. 3 to use. Pollution pattern programming circuitry 705 is typically used on boot up of the machine, with the programmed pollution pattern remaining unchanged in data chip 305 of FIG. 3 until the machine is booted up again, although embodiments of the inventive concept may support changing the programmed pollution patterns at any time.

In other embodiments of the inventive concept, data chips 305 of FIG. 3 may be programmed by the manufacturer of memory module 115 of FIG. 1 with pollution patterns. In such an embodiment of the inventive concept, it is assumed that each data chip in a particular channel has a unique pollution pattern. (Data chips in different channels may be distinguished by their channel, so data chips in different channels might have the same pollution pattern.) That way, when polluted data is detected, the particular chip with the error may (hopefully) be identified.

During normal operations, read circuitry 710 may send requests to read data from memory module 115 of FIG. 1, which may then be received by memory controller 125. Parity circuitry 715 may then perform a parity calculation on the data received from the data chips. If there were no errors reading the data from the data chips (or any errors were successfully corrected internally to the data chips), then the result of parity circuitry 715 should indicate no parity errors in the data received, and memory controller 125 may deliver the data to the host or other entity requesting the data.

But if the result of parity circuitry 715 indicates that there is a parity error, then memory controller 125 may attempt to correct the error. Pollution pattern analysis circuitry 725 may compare the result of parity circuitry 715 with the pollution patterns programmed into data chips 305 of FIG. 3 to see if a match (or a near match) may be found. If a match (or a near match) may be found, then error correction circuitry 730 may attempt to correct the error using information across all data chips 305 of FIG. 3 in memory module 115 of FIG. 1. If the error may not be corrected for any reason, log 735 may store information about the error.

Figure 8:
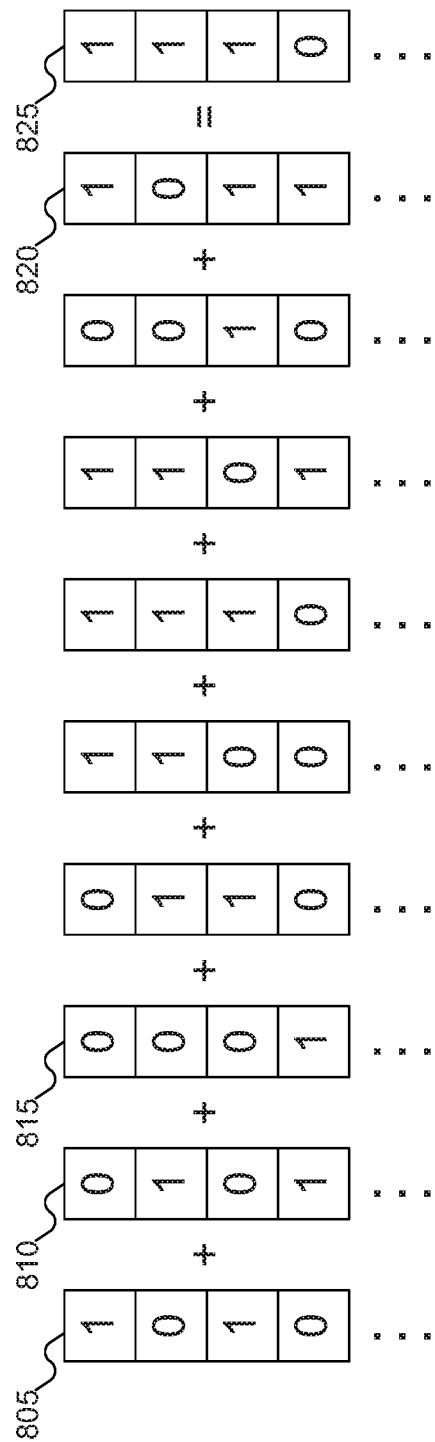
FIG. 8 shows the memory controller of FIG. 1 performing a parity calculation on data from the data chips in the memory of FIG. 1.

FIG. 8 shows memory controller 125 of FIG. 3 performing a parity calculation on data from data chips 305 of FIG. 3 in memory 115 of FIG. 1. In FIG. 8, original data 805, 810, 815, and so on through original data 820 may represent data from the various data chips in memory module 115 of FIG. 1. In FIG. 8, data from a total of 9 data chips are shown, but embodiments of the inventive concept may support data from any number of data chips. Note that one or more of data chips 305 of FIG. 3 may be the results from an in-chip ECC: original data 805, 810, 815, and 820 do not need to be strictly from chips that store real data.

Parity 825 is the result of calculating the parity of original data 805, 810, 815, and 820. Parity 825 may be calculated in any desired manner: in FIG. 8, parity 825 is calculated as the XOR of original data 805, 810, 815, and 820. If parity 825 is all zeroes, then memory controller 125 of FIG. 1 may conclude that there is no error in any of data chips 305 of FIG. 3. But if parity 825 has any ones (indicating a parity error), then that result indicates that there is at least one data chip 305 of FIG. 3 that has an error. Note that since one (or more) of the data chips will have had an uncorrectable error, the data from that/those chip(s) will be polluted by the pollution pattern(s) associated with the data chip(s).

The above description assumes that parity 825 includes all zeroes when there is no error. If parity 825 is calculated according to a different principle (e.g., all ones indicates no error), then the description may be adjusted as appropriate to fit the method of calculating parity 825.

Figures 9, 10:
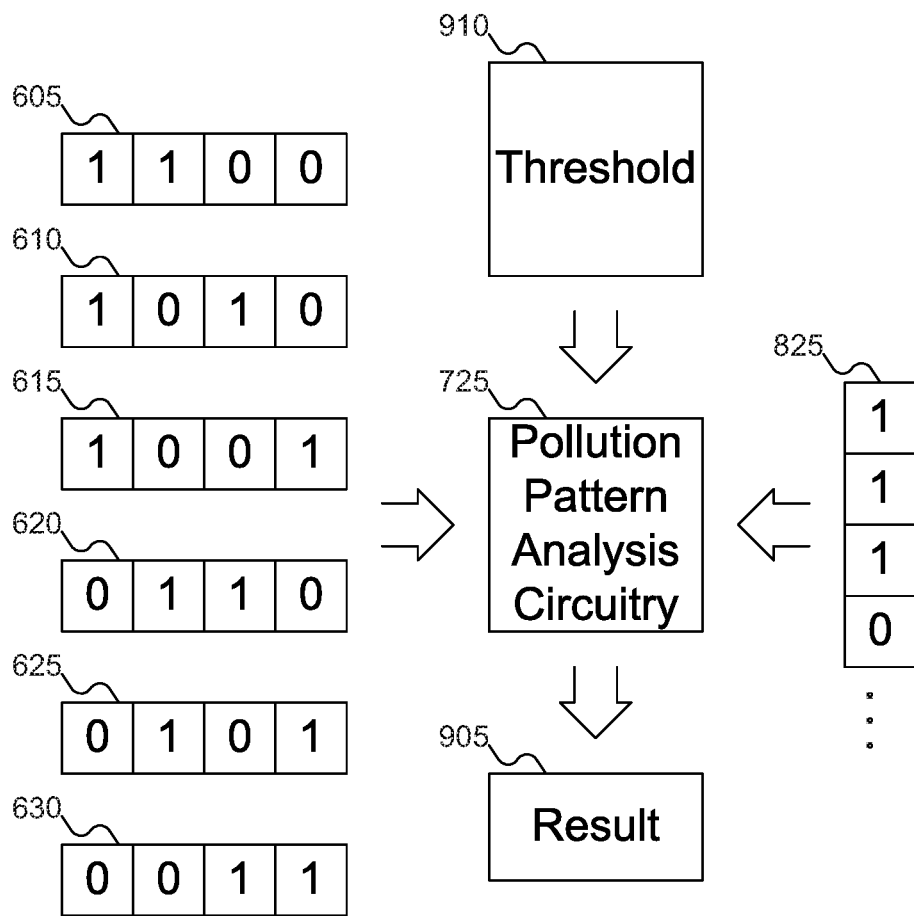
FIG. 9 shows the operation of the pollution pattern analysis circuitry of FIG. 7.
FIG. 10 shows the memory controller of FIG. 1 removing the pollution pattern from the data received from a data chip.

Assuming that parity 825 indicates that one data chip 305 of FIG. 3 has an error, memory controller 125 of FIG. 1 needs to determine which data chip has the error. Pollution pattern analysis circuitry 725 of FIG. 7, whose operation is shown in FIG. 9, performs this analysis. As shown in FIG. 9, pollution pattern analysis circuitry 725 may receive parity 825, along with pollution patterns 605, 610, 615, 620, 625, and 630. Although FIG. 9 shows six pollution patterns, embodiments of the inventive concept may support any number of pollution patterns. Pollution pattern analysis circuitry 725 may compare parity 825 with each of pollution patterns 605, 610, 615, 620, 625, and 630, and may attempt to determine pollution pattern is the closest to parity 825. The result of this comparison may be result 905.

Note that pollution pattern analysis circuitry 725 is described as attempting to determine the pollution pattern "closest" to parity 825. There are two reasons for this statement. First, the data chip with the error might include one or more errors that prevents parity 825 from exactly matching any of the programmed pollution patterns. For example, the error might force a particular bit to an incorrect value. In that case, that incorrect bit might look like data pollution even though the bit is not part of the pollution pattern, or it might look like a bit that was not part of the pattern, even though it was polluted. Second, because of data errors, parity 825 might be sufficiently far from any programmed pollution pattern that pollution pattern analysis circuitry 725 may not definitively determine which pollution pattern was used (and therefore which data chip has the error).

The solutions to these problems are twofold. First, pollution pattern analysis circuitry 725 may select the programmed pollution pattern that is closest to—that is, has the most bits matching—parity 825. (This comparison may be done either by matching all bits—both zeroes and ones—or just bits that are ones in the pollution pattern.) For example, parity 825 matches two bits of programmed pollution patterns 605, 610, and 620, and one bit of programmed pollution patterns 615, 625, and 630. While this might seem to be inconclusive, recall that each data chip 305 of FIG. 3 provides more than four bits of data. Thus, while pollution patterns 605, 610, 615, 620, 625, and 630 are repeated to cover the entirety of the data from the data chips, the number of errors themselves are not likely to repeat with the same frequency as the pollution pattern. For example, assuming that the data chip that had the error was the data chip that provided original data 805. In that case, the first two bits of parity 825 were contributed by the pollution pattern, whereas the third bit of parity 825 was due to data error. If the third bit is the only bit with a data error, then parity 825 would actually match all of the bits in the pollution pattern associated with the first data chip.

Second, pollution pattern analysis circuitry 725 may include threshold 910. Threshold 910 may specify a maximum distance—that is, number of different bits—between parity 825 and programmed pollution patterns 605, 610, 615, 620, 625, and 630. Provided that parity 825 is within threshold 910 of at least one of programmed pollution patterns 605, 610, 615, 620, 625, and 630, then the programmed pollution pattern that is closest to parity 825 may be selected. And if no pollution pattern is within threshold 910 of parity 825, memory controller 125 of FIG. 1, then memory controller 125 of FIG. 1 may conclude that the error may not be corrected. Threshold 910 may be set to any desired distance: for example, one half of the size of buffer 320 of FIG. 3 (which, of course, is equivalent to the size of the data received by memory controller 125 of FIG. 1 from data chip 305 of FIG. 3 and the size of parity 825) or one half the size of the pollution patterns (when the pollution pattern has fewer bits than buffer 320 of FIG. 3). But embodiments of the inventive concept may support other thresholds as well. Another criteria that may be used to determine threshold 910 may be the minimum number of bits of difference between any two programmed pollution patterns (considering the programmed pollution patterns to be repeated as needed to completely pollute buffer 320 of FIG. 3).

While FIGS. 8-9 describe using parity 825 as the source of data used to identify a pollution pattern, embodiments of the inventive concept may support other mechanisms to identify a pollution pattern. For example, instead of using parity 825, memory controller 125 of FIG. 7 may include a pollution pattern determination circuitry. The pollution pattern determination circuitry may perform any desired calculation on any or all of original data 805, 810, 815, and 820 of FIG. 8 to calculate a determined pollution pattern, which may then be compared with the programmed pollution patterns by pollution pattern analysis circuitry 725. In such an embodiment of the inventive concept, parity 825, may be used solely to determine if there is an error, whereas the pollution pattern determination circuitry may be used to determine what is expected to be the pollution pattern used by the data chip with the error.

FIG. 10 shows memory controller 125 of FIG. 3 removing the pollution pattern from parity 825 of FIG. 8 received from a data chip. In FIG. 10, after pollution pattern analysis circuitry 725 of FIG. 7 has determined that the pollution pattern used was pollution pattern 605 of FIG. 6, memory controller 125 of FIG. 3 may remove pollution pattern 605 from parity 825. If pollution pattern 605 was added to the raw data by XORing the raw data with pollution pattern 605, then pollution pattern 605 may be removed from parity 825 by XORing pollution pattern 605 with parity 825. If a different technique was used to pollute the raw data by the data chip, then a corresponding technique may be used to remove the pollution pattern from parity 825. Regardless of the technique used, the result is error 1005: the set of bits that are actually in error. Once these bits have been identified in error 1005, these bits may be corrected.

Figure 11:
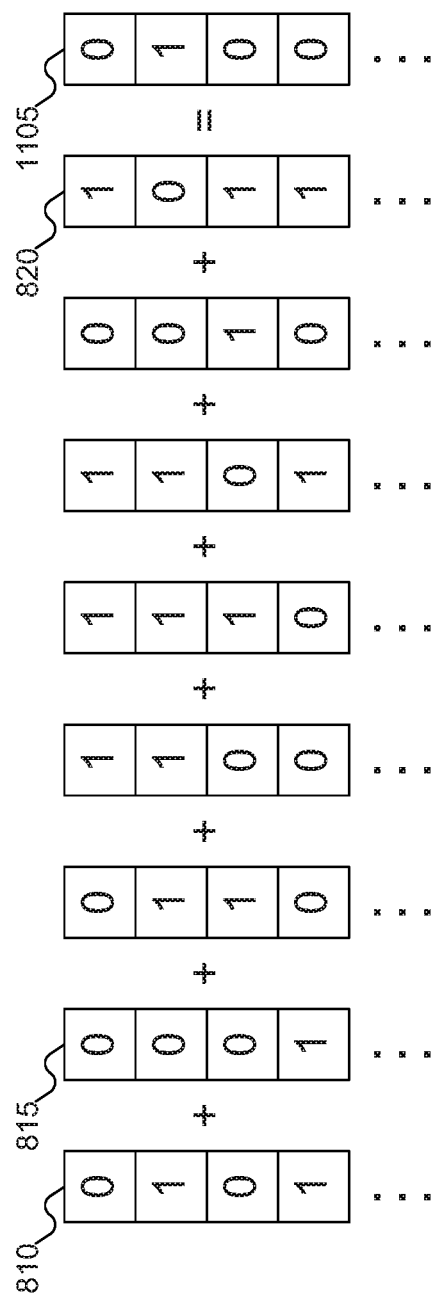
FIG. 11 shows the parity circuitry of FIG. 7 calculating the data for a data chip whose data had a pollution pattern.

One way to correct the bits is to use the original data from all the other data chips (including the parity data), to reconstruct the original bits that are in error from the data chip. This correction may be handled at the bit level, using any desired approach: for example, using parity information and the corresponding bits from the other data chips, the original bit in error may be reconstructed. But it may be simpler to just discard the data from the data chip with the error, and instead reconstruct the entirety of the data from the data chip with the error. FIG. 11 shows this approach.

In FIG. 11, the data for the data chip with the error (for example, original data 805 of FIG. 8) has been discarded. The entire data for the data chip with the error may be reconstructed from original data 810, 815, and so on through original data 820. Since the original data 810 815, and 820 may include information from a parity chip, original data 810, 815, and so on through 820 may include enough information to reconstruct the correct information for the data chip with the error. That is, by XORing original data 810, 815, and so on through 820, the result may recover the original data from the data chip with the error.

FIG. 11 shows how to reconstruct the original data from the data chip with the error where data from a parity chip is included. If some other technique is used to provide for error correction, the technique shown in FIG. 11 may be modified appropriately.

Figure 12A:
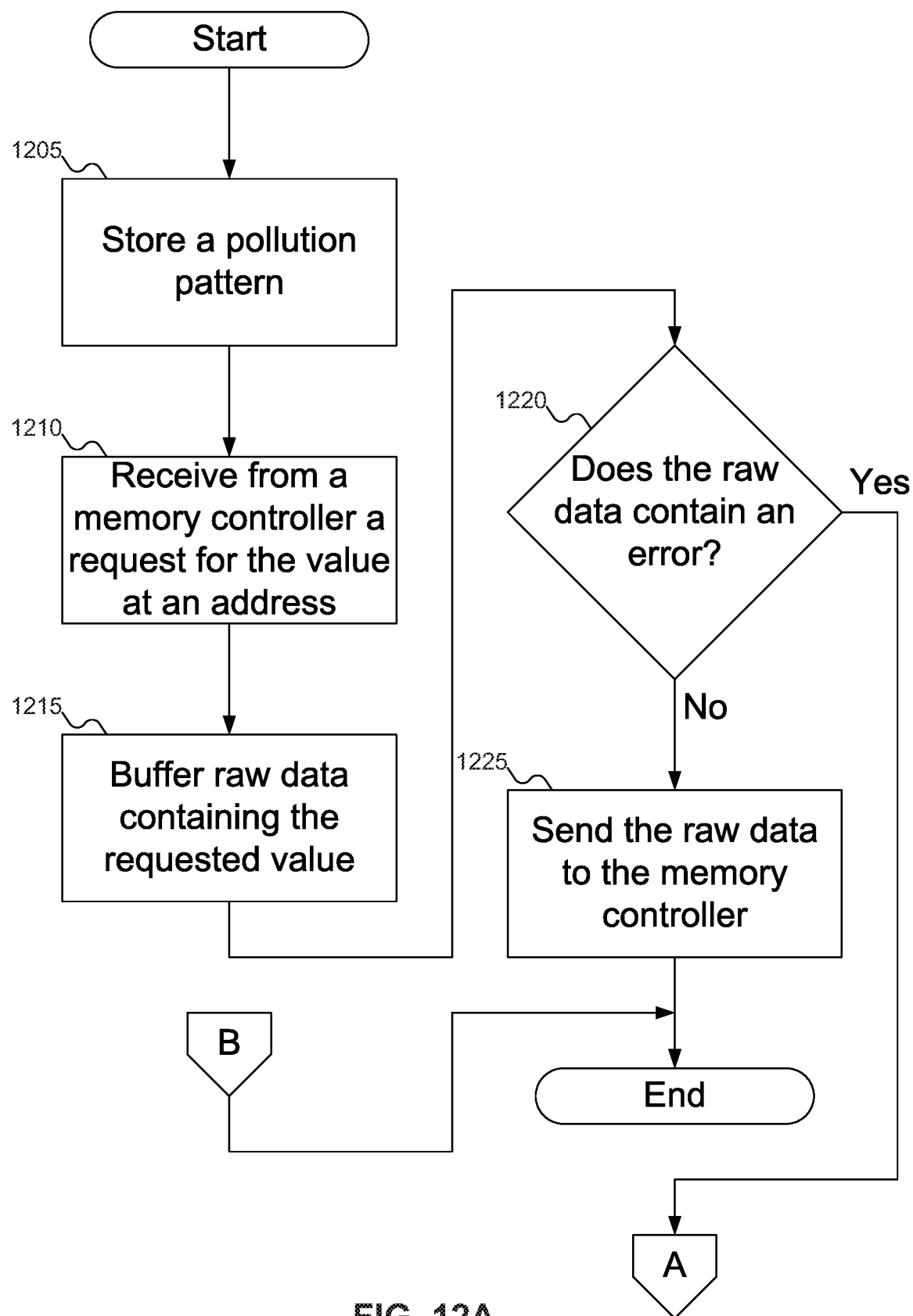
FIGS. 12A-12B show a flowchart of an example procedure for a data chip in the memory module of FIG. 1 to pollute data, according to an embodiment of the inventive concept.
Figure 12B:
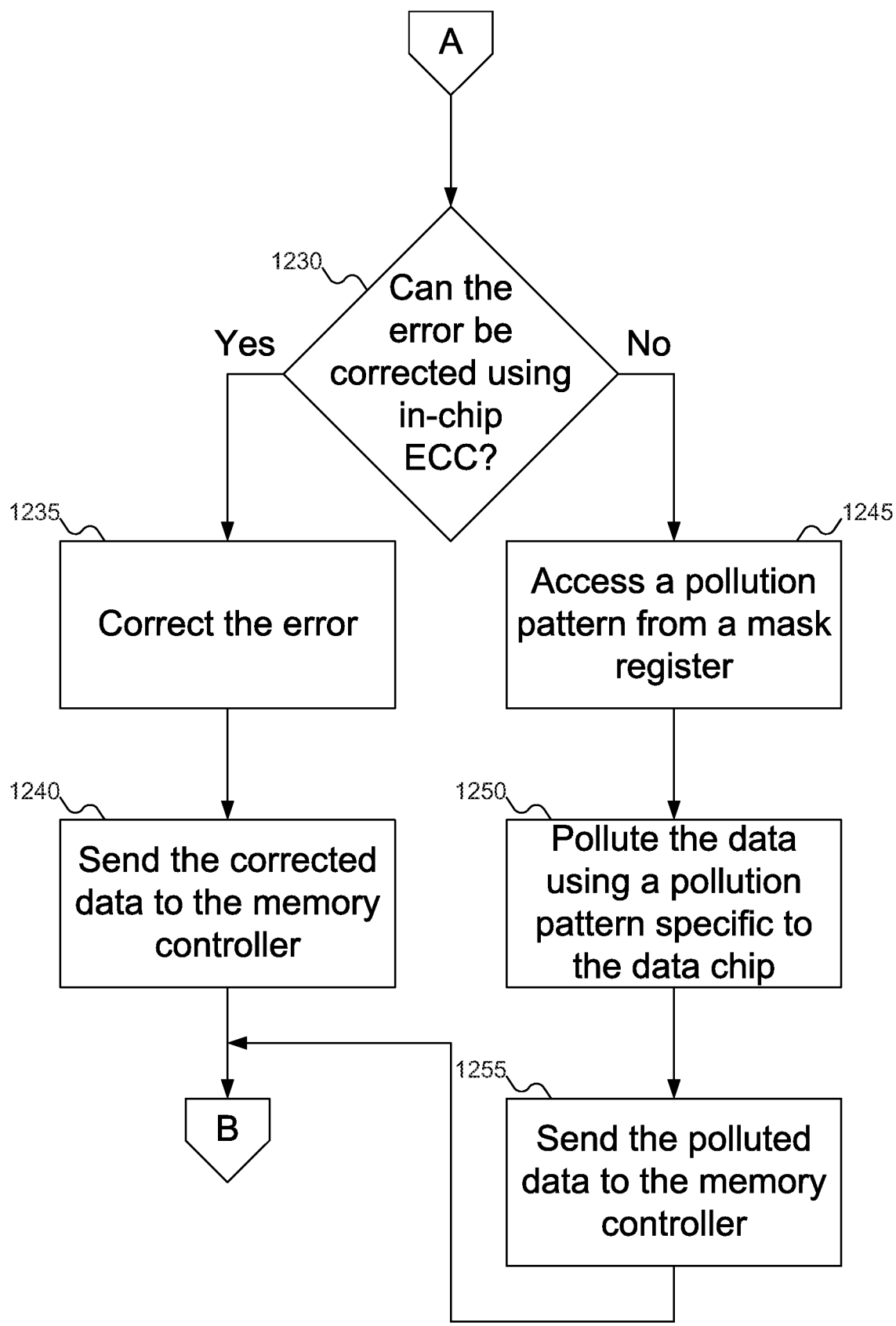
Figure 13:
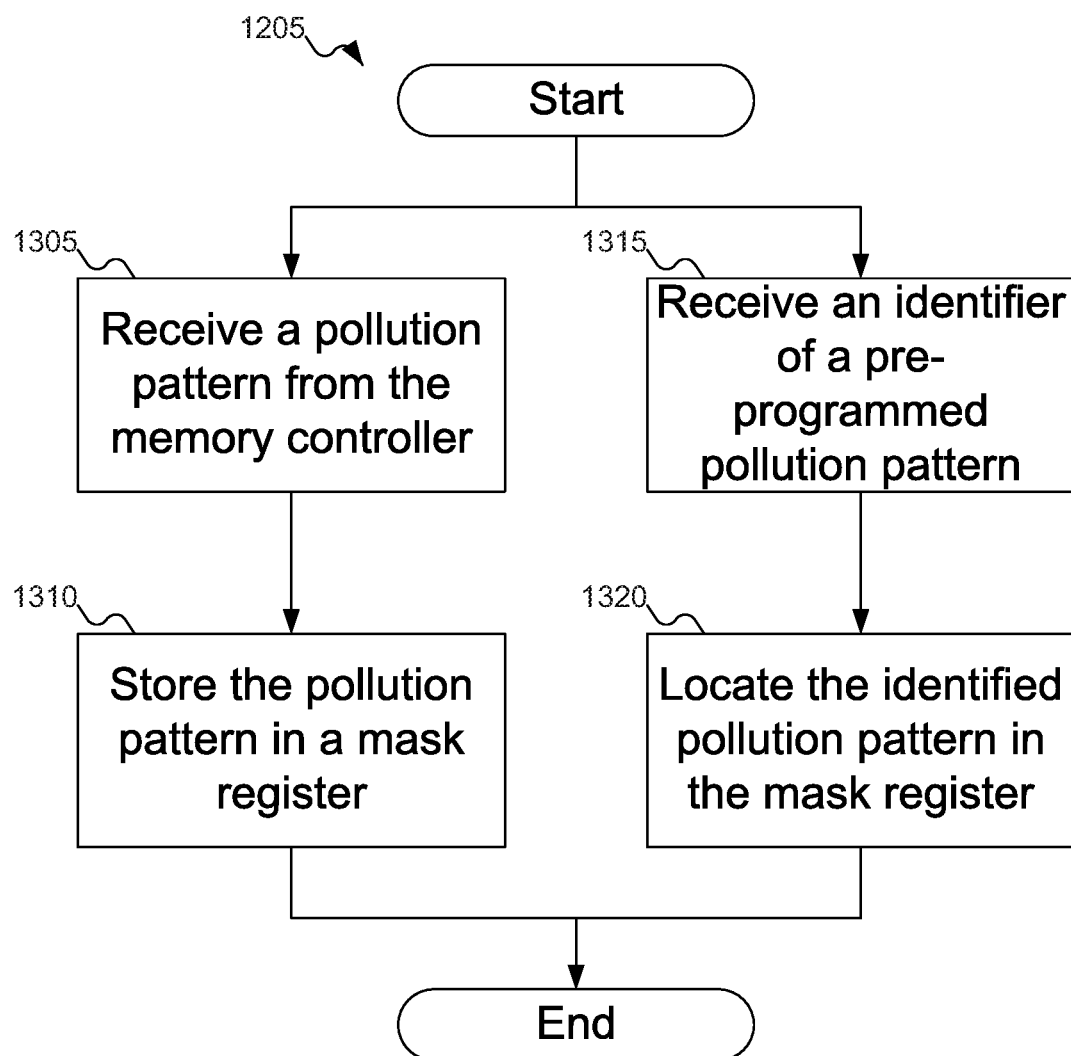
FIG. 13 shows a flowchart of an example procedure for the data chip in the memory module of FIG. 1 to be programmed with a pollution pattern, according to an embodiment of the inventive concept.

FIGS. 12A-12B show a flowchart of an example procedure for data chip 305 of FIG. 3 in memory module 115 of FIG. 1 to pollute data, according to an embodiment of the inventive concept. In FIG. 12A, at block 1205, data chip 305 of FIG. 3 may store a pollution pattern as instructed by memory controller 125 of FIG. 1. Block 1205 may be performed only upon the initial boot up of the system, rather than every time a memory access is performed. FIG. 13, described below, provides more details about how data chip 305 of FIG. 3 may store a pollution pattern. At block 1210, data chip 305 of FIG. 3 may receive a request for a value at a memory address from memory controller 125 of FIG. 1. This request may be part of a broader request for a value stored across all the data chips in memory module 115 of FIG. 1, as opposed to a request for data that is located solely within a single data chip or a request for data at that particular bit. At block 1215, buffer 320 of FIG. 3 may buffer the data retrieved from DRAM array 310 of FIG. 3. At block 1220, data chip 305 of FIG. 3 may determine if the data in buffer 320 of FIG. 3 contains an error. For example, data chip 305 of FIG. 3 might perform a parity calculation on the bits in buffer 320 of FIG. 3 to determine if there is an error, or ECC engine 325 of FIG. 3 might indicate that there is an error. If data chip 305 of FIG. 3 determines that there is no error, then at block 1225 transmission circuitry 345 of FIG. 3 may transmit the raw data to memory controller 125 of FIG. 1.

But if in block 1220 data chip 305 of FIG. 3 determines that there is an error, then at block 1230 (FIG. 12B) data chip 305 of FIG. 3 may determine if the error may be corrected using ECC engine 325 of FIG. 3. If the error is correctable, then at block 1235 ECC engine 325 of FIG. 3 may correct the error, after which at block 1240 the corrected data may be sent to memory controller 125 of FIG. 1 via transmission circuitry 345 of FIG. 3. Otherwise, at block 1245, data chip 305 of FIG. 3 may access a pollution pattern from mask register 335 of FIG. 3. At block 1250, data pollution engine 330 of FIG. 3 may pollute the data in buffer 320 of FIG. 3 using the accessed pollution pattern. As described above with reference to FIG. 3, polluting the data may be accomplished by XORing the data in buffer 320 of FIG. 3 with the pollution pattern. Finally, at block 1255, transmission circuitry 345 of FIG. 3 may transmit the polluted data to memory controller 125 of FIG. 1.

FIG. 13 shows a flowchart of an example procedure for data chip 305 in memory module 115 of FIG. 1 to be programmed with a pollution pattern, according to an embodiment of the inventive concept. In FIG. 13, at block 1305, data chip 305 of FIG. 3 may receive a pollution pattern from memory controller 125 of FIG. 1, and at block 1310, data chip 305 of FIG. 3 may store the received pollution pattern in mask register 335 of FIG. 3. Alternatively, at block 1315, data chip 305 of FIG. 3 may receive an identifier of a pollution pattern than has been pre-programmed into mask register 335 of FIG. 3, and at block 1320 data chip 305 of FIG. 3 may locate the identified pollution pattern in mask register 335 of FIG. 3 for use in polluting data when necessary.

Figure 14:
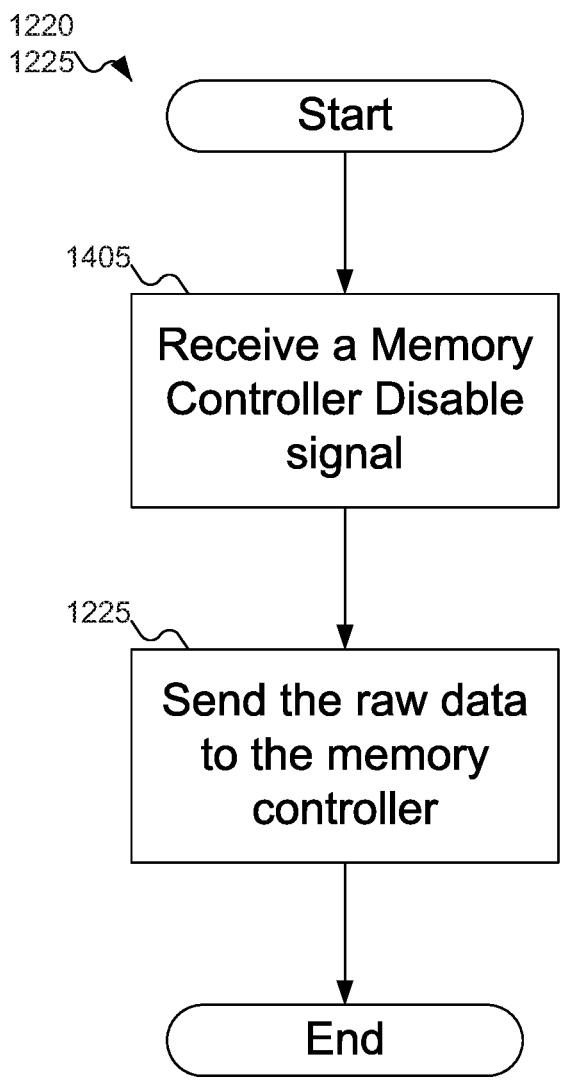
FIG. 14 shows a flowchart of an example procedure for the data chip in the memory module of FIG. 1 to transmit original data to the memory controller of FIG. 1, according to an embodiment of the inventive concept.

FIG. 14 shows a flowchart of an example procedure for data chip 305 of FIG. 3 in memory module 115 of FIG. 1 to transmit original data to memory controller 125 of FIG. 1, according to an embodiment of the inventive concept. As described above with reference to FIG. 3, memory controller 125 of FIG. 1 may transmit Memory Controller Disable signal 355 to data pollution engine 330. Memory Controller Disable signal 355 of FIG. 3 provides for a mechanism by which memory controller 125 of FIG. 1 may receive the raw data (i.e., unpolluted data) from buffer 320 of FIG. 3 when data pollution engine 330 of FIG. 3 might otherwise pollute data that contains an uncorrectable error. Memory Controller Disable signal 355 of FIG. 3 may be useful, for example, in situations where the pollution pattern may not be removed from the polluted data for some reason and memory controller 125 of FIG. 1 wants the unpolluted data.

In FIG. 14 at block 1405, data chip 305 of FIG. 3 may receive Memory Controller Disable signal 355 of FIG. 3. At block 1225 (functionally the same as block 1225 of FIG. 12A), transmission circuitry 345 of FIG. 3 may transmit the raw (unpolluted) data from buffer 320 of FIG. 3 to memory controller 125 of FIG. 1.

FIG. 14 may be thought of as a variation of blocks 1220-1225 of FIG. 12A. For example, the test performed in block 1220 of FIG. 12A may be a two-part test: first, is the raw data in buffer 320 of FIG. 3 error-free; and second, did data chip 305 of FIG. 3 receive Memory Controller Disable signal 355 of FIG. 3 from memory controller 125 of FIG. 1? If either part of the test result in an affirmative answer, then transmission circuitry 345 of FIG. 3 may transmit the raw data from buffer 320 of FIG. 3; otherwise, processing may continue with block 1230 of FIG. 12B.

Figure 15A:
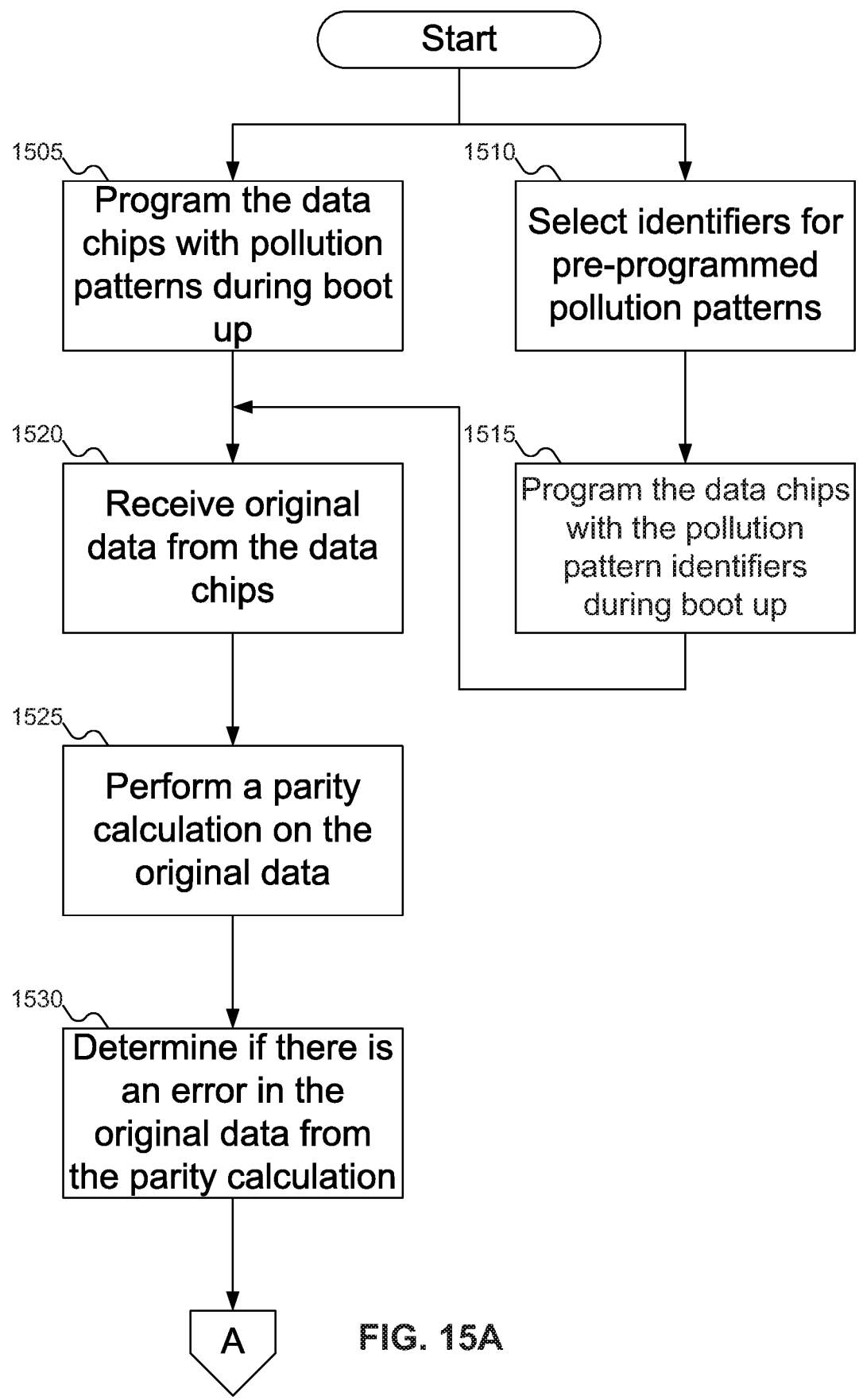
FIGS. 15A-15B show a flowchart of an example procedure for the memory controller of FIG. 1 to perform error correction when a data chip in the memory module of FIG. 1 pollutes data using a pollution pattern, according to an embodiment of the inventive concept.
Figure 15B:
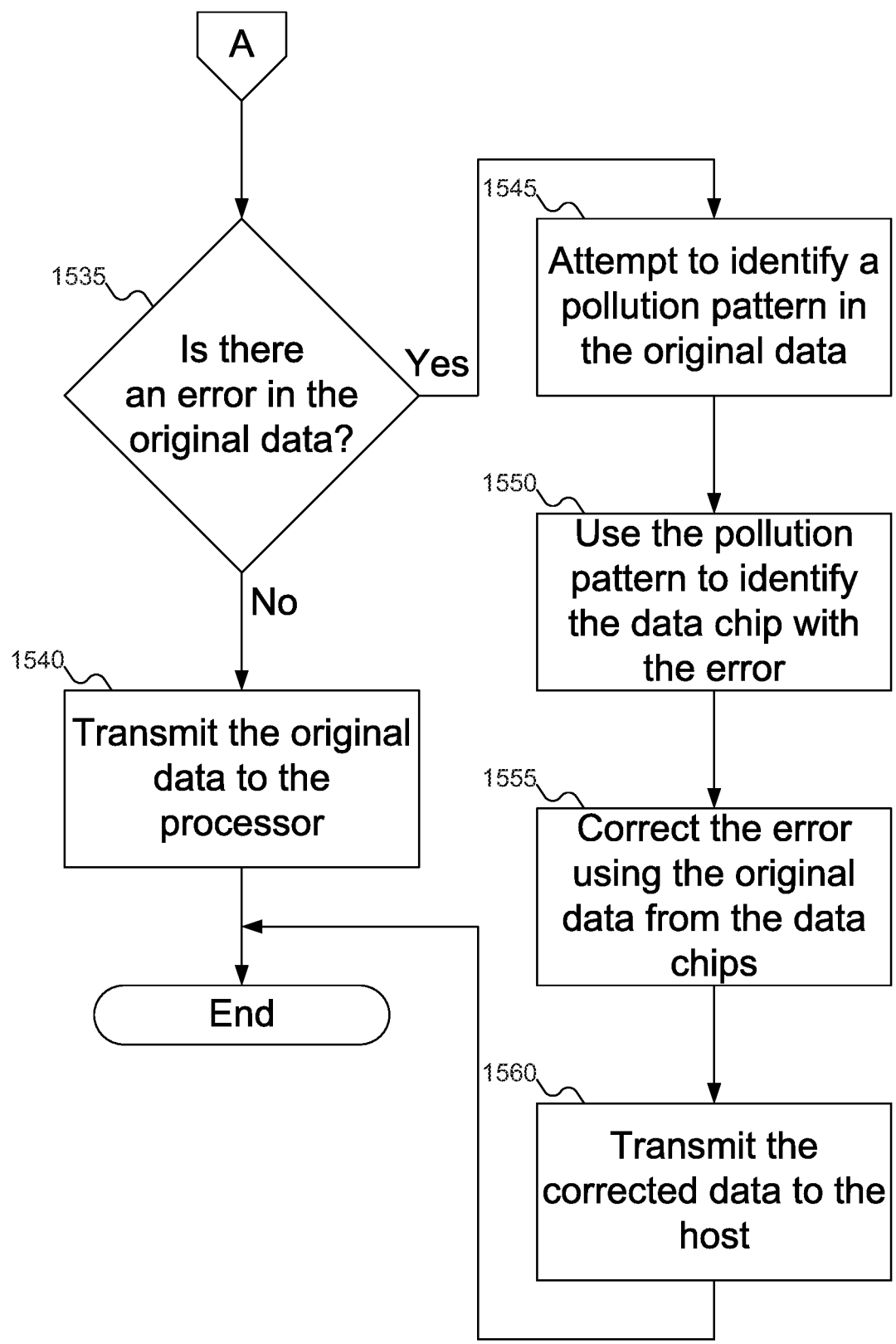

FIGS. 15A-15B show a flowchart of an example procedure for memory controller 125 of FIG. 1 to perform error correction when data chip 305 in memory module 115 of FIG. 1 pollutes data using a pollution pattern, according to an embodiment of the inventive concept. In FIG. 15A, at block 1505, memory controller 125 of FIG. 1 may program data chip 305 of FIG. 3 with a pollution pattern. In block 1505, memory controller 125 of FIG. 1 may select any desired pollution pattern, of either fine or coarse granularity. Alternatively, at block 1510, memory controller 125 of FIG. 1 may select the identifier of a pre-programmed pollution pattern, and at block 1515, memory controller 125 of FIG. 1 may program data chip 305 of FIG. 3 with the selected identifier. Like block 1205 of FIG. 12A, blocks 1505-1510 may be performed only upon the initial boot up of the system, rather than every time a memory access is performed.

Regardless of how memory controller 125 of FIG. 1 programs data chip 305 of FIG. 3 with a pollution pattern, at block 1520, read circuitry 710 of FIG. 7 may receive original data from data chip 305 of FIG. 3. At block 1525, parity circuitry 715 of FIG. 7 may calculate parity 825 of FIG. 8. At block 1530, memory controller 125 of FIG. 1 may determine if there is an error in the original data (based on parity 825 of FIG. 8). As described above, calculating parity 825 of FIG. 8 is one way, but not the only way, to determine if there is an error in the original data, and embodiments of the inventive concept may support using other techniques to determine if there is an error in the original data.

At block 1535 (FIG. 15B), memory controller 125 of FIG. 1 decides if there is an error in the original data. If there is no error in the original data, then at block 1540 memory controller 125 of FIG. 1 may transmit the original data to the processor. Otherwise, at block 1545, pollution pattern analysis circuitry 725 of FIG. 7 may attempt to identify the pollution pattern in parity 825. At block 1550, memory controller 125 may use the identified pollution pattern to identify data chip 305 of FIG. 3 with the error. At block 1555, error correction circuitry 730 of FIG. 7 may correct the error in data chip 305 of FIG. 3. Finally, at block 1560, memory controller 125 of FIG. 1 may transmit the corrected data to the host.

Figure 16:
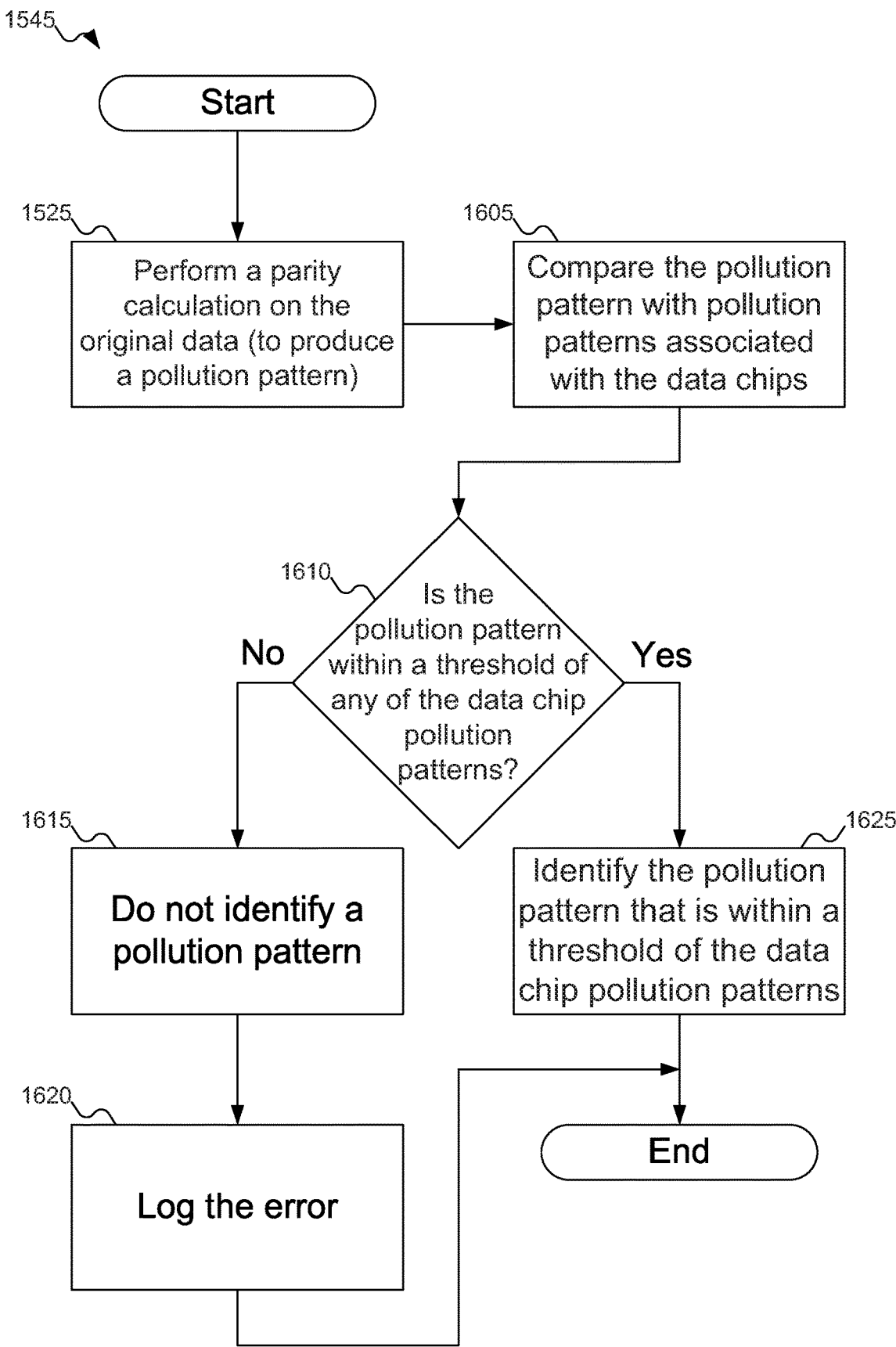
FIG. 16 shows a flowchart of an example procedure for the pollution pattern analysis circuitry of FIG. 7 to identify which pollution pattern was used to pollute the data, according to an embodiment of the inventive concept.

FIG. 16 shows a flowchart of an example procedure for pollution pattern analysis circuitry 725 of FIG. 7 to identify which pollution pattern was used to pollute the data, according to an embodiment of the inventive concept. In FIG. 16, at block 1525 (functionally similar to block 1525 of FIG. 15A, and in fact the two blocks may be a single operation), parity 825 of FIG. 8 may be calculated, to produce a computed pollution pattern. At block 1605, pollution pattern analysis circuitry 725 of FIG. 7 may compare the computed pollution pattern with the pollution patterns associated with the data chips in memory module 115 of FIG. 1. At block 1610, pollution pattern analysis circuitry 725 of FIG. 7 may determine if any of the pollution patterns associated with the data chips in memory module 115 of FIG. 1 are within a threshold distance of the computed pollution pattern. As described above with reference to FIG. 9, the distance may be measured as the number of bits that differ between the computed pollution pattern and the programmed pollution patterns, and the threshold may be any desired threshold.

If the computed pollution pattern is not within a threshold distance of any of the programmed pollution patterns, then at block 1615, memory controller 125 of FIG. 1 may decide not to identify a pollution pattern, and at block 1620, memory controller 125 of FIG. 1 may log the error as an uncorrectable error (UE) in log 735 of FIG. 7. Otherwise, at block 1625, pollution pattern analysis circuitry 725 of FIG. 7 may identify the pollution pattern that is closest to the computed pollution pattern, and thereby identify the data chip with the error.

Figure 17:
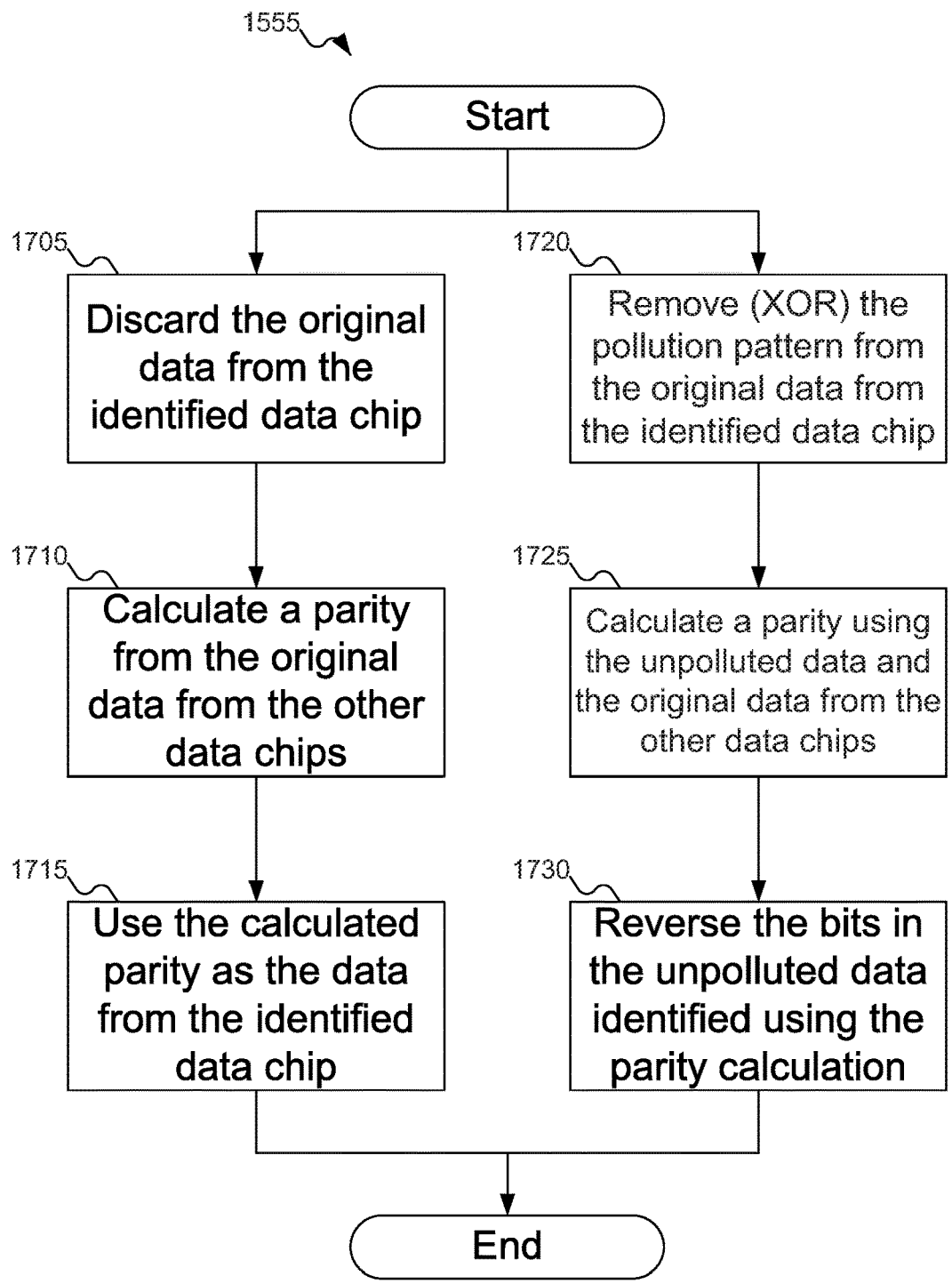
FIG. 17 shows a flowchart of an example procedure for the error correction circuitry of FIG. 7 to correct for the error in the data chip in the memory module of FIG. 1, according to an embodiment of the inventive concept.

FIG. 17 shows a flowchart of an example procedure for error correction circuitry 730 of FIG. 7 to correct for the error in data chip 305 of FIG. 3 in memory module 115 of FIG. 1, according to an embodiment of the inventive concept. In FIG. 17, at block 1705, error correction circuitry 730 of FIG. 7 may discard the data from data chip 305 with the error. At block 1710, error correction circuitry 730 of FIG. 7 may calculate a parity from the other data chips in memory module 115 of FIG. 1, and at block 1715, error correction circuitry 730 of FIG. 7 may use the calculated parity as the data from the identified data chip.

Alternatively, at block 1720, error correction circuitry 730 of FIG. 7 may remove the pollution pattern from the original data from data chip 305 of FIG. 3 with the error. At block 1725, error correction circuitry 730 of FIG. 7 may calculate a parity using the unpolluted data from data chip 305 of FIG. 3 with the error, and at block 1730, error correction circuitry 730 of FIG. 7 may reverse the bits in the unpolluted data based on the calculated parity.

Figure 18:
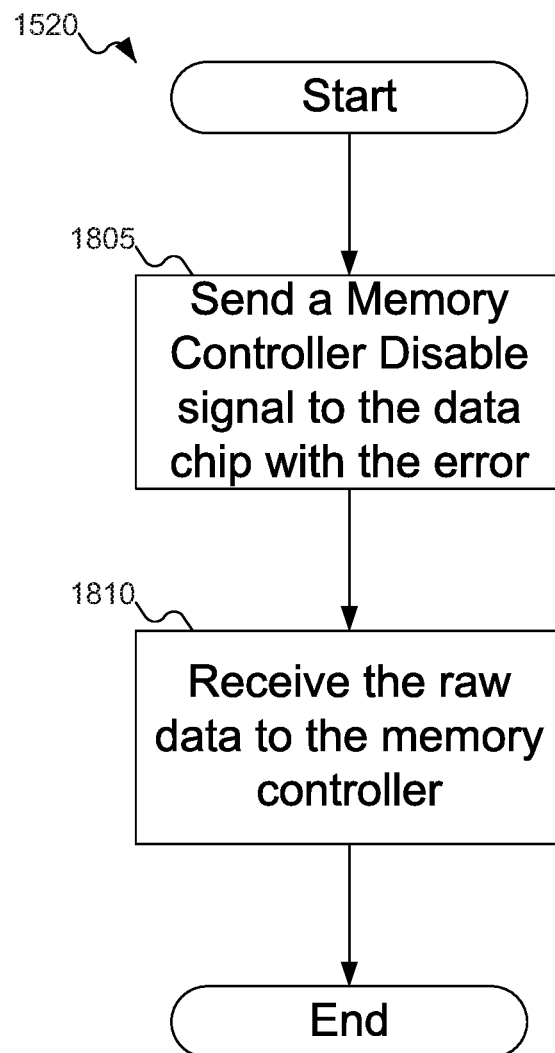
FIG. 18 shows a flowchart of an example procedure for the memory controller of FIG. 1 to request the original data from the data chip in the memory module of FIG. 1, according to an embodiment of the inventive concept.

FIG. 18 shows a flowchart of an example procedure for memory controller 125 of FIG. 1 to request the original data from data chip 305 in memory module 115 of FIG. 1, according to an embodiment of the inventive concept. In FIG. 18, at block 1805, memory controller 125 of FIG. 1 may send Memory Controller Disable signal 355 of FIG. 3 to data chip 305 of FIG. 3. At block 1810, memory controller 125 of FIG. 1 may receive the raw data from data chip 305 of FIG. 3

In FIGS. 12A-18, some embodiments of the inventive concept are shown. But a person skilled in the art will recognize that other embodiments of the inventive concept are also possible, by changing the order of the blocks, by omitting blocks, or by including links not shown in the drawings. All such variations of the flowcharts are considered to be embodiments of the inventive concept, whether expressly described or not.

The following discussion is intended to provide a brief, general description of a suitable machine or machines in which certain aspects of the inventive concept may be implemented. The machine or machines may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines may include embedded controllers, such as programmable or non-programmable logic devices or arrays, Application Specific Integrated Circuits (ASICs), embedded computers, smart cards, and the like. The machine or machines may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciate that network communication may utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Embodiments of the inventive concept may include a tangible, non-transitory machine-readable medium comprising instructions executable by one or more processors, the instructions comprising instructions to perform the elements of the inventive concepts as described herein.

Having described and illustrated the principles of the inventive concept with reference to illustrated embodiments, it will be recognized that the illustrated embodiments may be modified in arrangement and detail without departing from such principles, and may be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms may reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the inventive concept may extend to the following statements, without limitation:

Statement 1. An embodiment of the inventive concept includes a data chip, comprising:
 a data array;
 read circuitry to read raw data from the data array;
 a buffer to store the raw data read from the data array by the read circuitry;
 a mask register to store a pollution pattern;
 a data pollution engine to modify the raw data stored in the buffer using the pollution pattern stored in the mask register to produce a polluted data; and
 transmission circuitry to transmit the polluted data from the buffer.

Statement 2. An embodiment of the inventive concept includes a data chip according to statement 1, wherein the data chip is included in a Dynamic Random Access Memory (DRAM) module.

Statement 3. An embodiment of the inventive concept includes a data chip according to statement 1, wherein:
 the data chip is included in a Dynamic Random Access Memory (DRAM) module the DRAM module including a plurality of other data chips, and
 the pollution pattern stored the mask register of the data chip (305) differs from pollution patterns stored in the plurality of other data chips in the DRAM module.

Statement 4. An embodiment of the inventive concept includes a data chip according to statement 1, wherein the transmission circuitry is operative to transmit the polluted data to a memory controller.

Statement 5. An embodiment of the inventive concept includes a data chip according to statement 1, wherein:
 the data chip further comprises an error correcting code (ECC) circuitry to perform error correction on the raw data stored in the buffer; and
 the data pollution engine is operative to modify the raw data stored in the buffer using the pollution pattern stored in the mask register when the ECC circuitry detects but may not correct an error in the raw data stored in the buffer.

Statement 6. An embodiment of the inventive concept includes a data chip according to statement 1, wherein the data pollution engine includes XOR circuitry to perform an XOR operation on the raw data stored in the buffer and the pollution pattern stored in the mask register.

Statement 7. An embodiment of the inventive concept includes a data chip according to statement 1, wherein the data pollution engine is operative to modify the raw data stored in the buffer using the pollution pattern stored in the mask register unless the data pollution engine receives a Memory Controller Disable signal from a memory controller.

Statement 8. An embodiment of the inventive concept includes a data chip according to statement 1, wherein the pollution pattern is programmed into the mask register inside the data chip by a memory controller on boot up.

Statement 9. An embodiment of the inventive concept includes a data chip according to statement 1, wherein:
 the pollution pattern is one of a plurality of pre-programmed pollution patterns stored in the mask register; and
 the data chip may receive from the memory controller 125 an identifier of the pollution pattern to use from the mask register.

Statement 10. An embodiment of the inventive concept includes a memory controller, comprising:
 read circuitry to request a value at an address stored in a plurality of data chips;
 parity circuitry to calculate a parity from original data received from the plurality of the data chips;
 pollution pattern analysis circuitry to compare the parity with a plurality of pollution patterns programmed into the plurality of the data chips to identify a data chip with an error; and
 error correction circuitry to correct the error in the original data received from the identified data chip with the error.

Statement 11. An embodiment of the inventive concept includes a memory controller according to statement 10, wherein the plurality of data chips are included in a Dynamic Random Access Memory (DRAM) module.

Statement 12. An embodiment of the inventive concept includes a memory controller according to statement 10, wherein the pollution pattern analysis circuitry and the error correction circuitry are utilized only if the parity circuitry indicates that there is an error in the original data received from the plurality of the data chips.

Statement 13. An embodiment of the inventive concept includes a memory controller according to statement 12, wherein the calculated parity from the original data received from the plurality of the data chips indicates if there is an error in the original data received from the plurality of the data chips.

Statement 14. An embodiment of the inventive concept includes a memory controller according to statement 10, wherein the pollution pattern analysis circuitry is operative to identify one of the plurality of pollution patterns programmed into the plurality of the data chips that is closest to the parity.

Statement 15. An embodiment of the inventive concept includes a memory controller according to statement 14, wherein the pollution pattern analysis circuitry is further operative to determine if the identified one of the pollution patterns programmed into the plurality of the data chips is within a threshold of the parity.

Statement 16. An embodiment of the inventive concept includes a memory controller according to statement 15, wherein the threshold is one half of a size of the parity.

Statement 17. An embodiment of the inventive concept includes a memory controller according to statement 15, wherein the pollution pattern analysis circuitry is further operative to not identify any of the pollution patterns programmed into the plurality of the data chips if none of the pollution patterns programmed into the plurality of the data chips is within the threshold of the parity.

Statement 18. An embodiment of the inventive concept includes a memory controller according to statement 17, further comprising a log to log that none of the pollution patterns programmed into the plurality of the data chips is within the threshold of the parity.

Statement 19. An embodiment of the inventive concept includes a memory controller according to statement 14, wherein the pollution pattern analysis circuitry is operative to identify the one of the plurality of pollution patterns programmed into the plurality of the data chips that has the most bits that match bits in the parity pollution pattern.

Statement 20. An embodiment of the inventive concept includes a memory controller according to statement 14, wherein the pollution pattern analysis circuitry is operative to identify one of the plurality of the data chips associated with the identified one of the plurality of pollution patterns programmed into the plurality of the data chips as the identified data chip with the error.

Statement 21. An embodiment of the inventive concept includes a memory controller according to statement 14, wherein:

the memory controller is operative to send the identified data chip with the error a Memory Controller Disable signal; and the read circuitry is operative to receive a raw data from the identified data chip with the error.

Statement 22. An embodiment of the inventive concept includes a memory controller according to statement 10, wherein the error correction circuitry is operative to recreate the data from the identified data chip with the error using the original data from the others of the plurality of the data chips.

Statement 23. An embodiment of the inventive concept includes a memory controller according to statement 22, wherein the parity circuitry is operative to recreate the data from the identified data chip with the error by calculating a parity for the original data from others of the plurality of the data chips.

Statement 24. An embodiment of the inventive concept includes a memory controller according to statement 10, wherein the error correction circuitry is operative to remove the parity from the original data received from the identified data chip with the error and to correct the error in the unpolluted data from the identified data chip with the error using the unpolluted data from the identified data chip with the error and the original data from others of the plurality of the data chips.

Statement 25. An embodiment of the inventive concept includes a memory controller according to statement 24, wherein the error correction circuitry is further operative to calculate a parity for the unpolluted data from the identified data chip with the error and the original data from others of the plurality of the data chips and to reverse at least one bit in the unpolluted data from the identified data chip with the error based on the calculated parity.

Statement 26. An embodiment of the inventive concept includes a memory controller according to statement 10, further comprising pollution pattern programming circuitry to select a plurality of pollution patterns for the plurality of the data chips during boot up.

Statement 27. An embodiment of the inventive concept includes a memory controller according to statement 26, wherein the plurality of pollution patterns are all unique.

Statement 28. An embodiment of the inventive concept includes a memory controller according to statement 26, wherein the pollution pattern programming circuitry is operative to program the plurality of the data chips with the plurality of pollution patterns during the boot up.

Statement 29. An embodiment of the inventive concept includes a memory controller according to statement 26, wherein the pollution pattern programming circuitry is operative to select a plurality of identifiers of pre-programmed pollution patterns for the plurality of the data chips during the boot up and to program the plurality of the data chips with the selected plurality of identifiers during the boot up.

Statement 30. An embodiment of the inventive concept includes a method, comprising receiving at a data chip a request for value at an address;

buffering raw data in a buffer of the data chip, the raw data including the value at the address;

determining if the raw data in the buffer has an error; and if the raw data in the buffer has an error:

polluting the raw data in the buffer using a pollution pattern to produce a polluted data; and sending the polluted data in the buffer to a memory controller.

Statement 31. An embodiment of the inventive concept includes a method according to statement 30, wherein polluting the raw data in the buffer using a pollution pattern includes XORing the raw data in the buffer with the pollution pattern.

Statement 32. An embodiment of the inventive concept includes a method according to statement 30, further comprising, if the raw data in the buffer does not have an error, sending the raw data in the buffer to the memory controller.

Statement 33. An embodiment of the inventive concept includes a method according to statement 30, wherein the data chip is included in a Dynamic Random Access Memory (DRAM) module.

Statement 34. An embodiment of the inventive concept includes a method according to statement 30, further comprising, if the raw data in the buffer has an error:

determining if the error in the raw data in the buffer may be corrected; and if the error in the raw data in the buffer may not be corrected:

polluting the raw data in the buffer using the pollution pattern; and sending the polluted data in the buffer to the memory controller.

Statement 35. An embodiment of the inventive concept includes a method according to statement 34, further comprising, if the error in the raw data in the buffer may be corrected:

correcting the raw data in the buffer; and sending the corrected data in the buffer to the memory controller.

Statement 36. An embodiment of the inventive concept includes a method according to statement 30, wherein polluting the raw data in the buffer using a pollution pattern includes accessing the pollution pattern from a mask register in the data chip.

Statement 37. An embodiment of the inventive concept includes a method according to statement 36, further comprising:

receiving the pollution pattern from the memory controller; and storing the received pollution pattern in the mask register.

Statement 38. An embodiment of the inventive concept includes a method according to statement 36, wherein:

the method further comprises receiving a pollution pattern identifier from the memory controller; and accessing the pollution pattern from a mask register in the data chip includes accessing the pollution pattern from the mask register in the data chip responsive to the pollution pattern identifier.

Statement 39. An embodiment of the inventive concept includes a method according to statement 30, wherein the pollution pattern includes a first width equal to a second width of the buffer.

Statement 40. An embodiment of the inventive concept includes a method according to statement 30, wherein the pollution pattern includes a first width less than a second width of the buffer, the pollution pattern repeated to be at least as wide as the buffer.

Statement 41. An embodiment of the inventive concept includes a method according to statement 30, further comprising:

receiving a Memory Controller Disable signal at the data chip; and sending the raw data in the buffer to the memory controller.

Statement 42. An embodiment of the inventive concept includes a method, comprising:

receiving original data from a plurality of data chips;

determining if the original data from at least one of the plurality of the data chips has an error;

if the original data from at least one of the plurality of the data chips has the error:

attempting to identify a pollution pattern using the original data from the plurality of the data chips;

using the pollution pattern to identify the at least one of the plurality of the data chips that has the error; and correcting the error in the original data from the plurality of the data chips responsive to the pollution pattern and the original data from the plurality of the data chips.

Statement 43. An embodiment of the inventive concept includes a method according to statement 42, wherein plurality of the data chips are included in a Dynamic Random Access Memory (DRAM) module.

Statement 44. An embodiment of the inventive concept includes a method according to statement 42, further comprising transmitting the corrected data to a host.

Statement 45. An embodiment of the inventive concept includes a method according to statement 42, wherein, if the original data from at least one of the plurality of the data chips does not have the error, transmitting the original data to a host.

Statement 46. An embodiment of the inventive concept includes a method according to statement 42, wherein determining if the original data from at least one of the plurality of the data chips has an error includes:

performing a parity calculation on the original data from the plurality of the data chips; and determining if the original data from the at least one of the plurality of the data chips has the error if the parity calculation indicates a parity error.

Statement 47. An embodiment of the inventive concept includes a method according to statement 42, wherein attempting to identify a pollution pattern using the original data from the plurality of the data chips includes:

computing a pollution pattern from the original data from the plurality of the data chips;

comparing the computed pollution pattern with a plurality of pollution patterns associated with the plurality of the data chips; and if one of the plurality of the pollution patterns associated with the plurality of the data chips is within a threshold of the computed pollution pattern, identifying the pollution pattern that is within a threshold of the computed pollution pattern.

Statement 48. An embodiment of the inventive concept includes a method according to statement 47, wherein comparing the computed pollution pattern with a plurality of pollution patterns associated with the plurality of the data chips includes identifying the one of the plurality of the pollution patterns associated with the plurality of the data chips that is closest to the computed pollution pattern.

Statement 49. An embodiment of the inventive concept includes a method according to statement 48, wherein identifying the one of the plurality of the pollution patterns associated with the plurality of the data chips that is closest to the computed pollution pattern includes identifying the one of the plurality of the pollution patterns associated with the plurality of the data chips that has the most bits that match bits in the computed pollution pattern.

Statement 50. An embodiment of the inventive concept includes a method according to statement 47, wherein the threshold is one half of a size of the computed pollution pattern.

Statement 51. An embodiment of the inventive concept includes a method according to statement 47, wherein if none of the plurality of the pollution patterns associated with the plurality of the data chips is within the threshold of the computed pollution pattern, not identifying any pollution pattern associated with the plurality of the data chips.

Statement 52. An embodiment of the inventive concept includes a method according to statement 51, further comprising logging the error as an uncorrectable error (UE).

Statement 53. An embodiment of the inventive concept includes a method according to statement 47, further comprising:

sending the identified at least one of the plurality of the data chips that has the error a Memory Controller Disable signal; and receiving a raw data from the identified at least one of the plurality of the data chips that has the error.

Statement 54. An embodiment of the inventive concept includes a method according to statement 47, wherein correcting the error in the original data from the plurality of the data chips responsive to the pollution pattern and the original data from the plurality of the data chips includes:

discarding the original data from the identified at least one of the plurality of the data chips that has the error; and recreating the data from the identified at least one of the plurality of the data chips that has the error using the original data from the others of the plurality of the data chips.

Statement 55. An embodiment of the inventive concept includes a method according to statement 54, wherein recreating the data from the identified at least one of the plurality of the data chips that has the error using the original data from the others of the plurality of the data chips includes:

calculating a parity for the original data from the others of the plurality of the data chips; and using the calculated parity as the data from the identified at least one of the plurality of the data chips that has the error.

Statement 56. An embodiment of the inventive concept includes a method according to statement 47, wherein correcting the error in the original data from the plurality of the data chips responsive to the pollution pattern and the original data from the plurality of the data chips includes:

removing the identified pollution pattern from the original data from the identified at least one of the plurality of the data chips that has the error, producing unpolluted data; and correcting the error in the unpolluted data from the identified at least one of the plurality of the data chips that has the error using the unpolluted data from the identified at least one of the plurality of the data chips that has the error and the original data from the others of the plurality of the data chips.

Statement 57. An embodiment of the inventive concept includes a method according to statement 56, wherein removing the identified pollution pattern from the original data from the identified at least one of the plurality of the data chips that has the error, producing unpolluted data includes XORing the identified pollution pattern with the original data from the identified at least one of the plurality of the data chips that has the error.

Statement 58. An embodiment of the inventive concept includes a method according to statement 56, wherein correcting the error in the unpolluted data from the identified at least one of the plurality of the data chips that has the error using the unpolluted data from the identified at least one of the plurality of the data chips that has the error and the original data from the others of the plurality of the data chips includes:

calculating a parity for the unpolluted data from the identified at least one of the plurality of the data chips that has the error and the original data from the others of the plurality of the data chips; and reversing at least one bit in the unpolluted data from the identified at least one of the plurality of the data chips that has the error based on the calculated parity.

Statement 59. An embodiment of the inventive concept includes a method according to statement 42, further comprising selecting a plurality of pollution patterns for the plurality of the data chips during boot up.

Statement 60. An embodiment of the inventive concept includes a method according to statement 59, wherein selecting a plurality of pollution patterns for the plurality of the data chips includes programming the plurality of the data chips with the plurality of pollution patterns during the boot up.

Statement 61. An embodiment of the inventive concept includes a method according to statement 59, wherein selecting a plurality of pollution patterns for the plurality of the data chips includes:

selecting a plurality of identifiers of pre-programmed pollution patterns for the plurality of the data chips during the boot up; and programming the plurality of the data chips with the selected plurality of identifiers during the boot up.

Statement 62. An embodiment of the inventive concept includes an article, comprising a tangible storage medium, the tangible storage medium having stored thereon non-transitory instructions that, when executed by a machine, result in receiving at a data chip a request for value at an address;

buffering raw data in a buffer of the data chip, the raw data including the value at the address;

determining if the raw data in the buffer has an error; and if the raw data in the buffer has an error:

polluting the raw data in the buffer using a pollution pattern to produce a polluted data; and sending the polluted data in the buffer to a memory controller.

Statement 63. An embodiment of the inventive concept includes an article according to statement 62, wherein polluting the raw data in the buffer using a pollution pattern includes XORing the raw data in the buffer with the pollution pattern.

Statement 64. An embodiment of the inventive concept includes an article according to statement 62, the tangible storage medium having stored thereon further non-transitory instructions that, when executed by the machine, result in, if the raw data in the buffer does not have an error, sending the raw data in the buffer to the memory controller.

Statement 65. An embodiment of the inventive concept includes an article according to statement 62, wherein the data chip is included in a Dynamic Random Access Memory (DRAM) module.

Statement 66. An embodiment of the inventive concept includes an article according to statement 62, the tangible storage medium having stored thereon further non-transitory instructions that, when executed by the machine, result in, if the raw data in the buffer has an error:

determining if the error in the raw data in the buffer may be corrected; and if the error in the raw data in the buffer may not be corrected:

polluting the raw data in the buffer using the pollution pattern; and sending the polluted data in the buffer to the memory controller.

Statement 67. An embodiment of the inventive concept includes an article according to statement 66, the tangible storage medium having stored thereon further non-transitory instructions that, when executed by the machine, result in, if the error in the raw data in the buffer may be corrected:

correcting the raw data in the buffer; and sending the corrected data in the buffer to the memory controller.

Statement 68. An embodiment of the inventive concept includes an article according to statement 62, wherein polluting the raw data in the buffer using a pollution pattern includes accessing the pollution pattern from a mask register in the data chip.

Statement 69. An embodiment of the inventive concept includes an article according to statement 68, the tangible storage medium having stored thereon further non-transitory instructions that, when executed by the machine, result in:

receiving the pollution pattern from the memory controller; and storing the received pollution pattern in the mask register.

Statement 70. An embodiment of the inventive concept includes an article according to statement 68, wherein:

the method further comprises receiving a pollution pattern identifier from the memory controller; and accessing the pollution pattern from a mask register in the data chip includes accessing the pollution pattern from the mask register in the data chip responsive to the pollution pattern identifier.

Statement 71. An embodiment of the inventive concept includes an article according to statement 62, wherein the pollution pattern includes a first width equal to a second width of the buffer.

Statement 72. An embodiment of the inventive concept includes an article according to statement 62, wherein the pollution pattern includes a first width less than a second width of the buffer, the pollution pattern repeated to be at least as wide as the buffer.

Statement 73. An embodiment of the inventive concept includes an article according to statement 62, the tangible storage medium having stored thereon further non-transitory instructions that, when executed by the machine, result in:

receiving a Memory Controller Disable signal at the data chip; and sending the raw data in the buffer to the memory controller.

Statement 74. An embodiment of the inventive concept includes an article, comprising a tangible storage medium, the tangible storage medium having stored thereon non-transitory instructions that, when executed by a machine, result in:

receiving original data from a plurality of data chips;

determining if the original data from at least one of the plurality of the data chips has an error;

if the original data from at least one of the plurality of the data chips has the error:

attempting to identify a pollution pattern using the original data from the plurality of the data chips;

using the pollution pattern to identify the at least one of the plurality of the data chips that has the error; and correcting the error in the original data from the plurality of the data chips responsive to the pollution pattern and the original data from the plurality of the data chips.

Statement 75. An embodiment of the inventive concept includes an article according to statement 74, wherein plurality of the data chips are included in a Dynamic Random Access Memory (DRAM) module.

Statement 76. An embodiment of the inventive concept includes an article according to statement 74, the tangible storage medium having stored thereon further non-transitory instructions that, when executed by the machine, result in transmitting the corrected data to a host.

Statement 77. An embodiment of the inventive concept includes an article according to statement 74, wherein, if the original data from at least one of the plurality of the data chips does not have the error, transmitting the original data to a host.

Statement 78. An embodiment of the inventive concept includes an article according to statement 74, wherein determining if the original data from at least one of the plurality of the data chips has an error includes:

performing a parity calculation on the original data from the plurality of the data chips; and determining if the original data from the at least one of the plurality of the data chips has the error if the parity calculation indicates a parity error.

Statement 79. An embodiment of the inventive concept includes an article according to statement 74, wherein attempting to identify a pollution pattern using the original data from the plurality of the data chips includes:

computing a pollution pattern from the original data from the plurality of the data chips;

comparing the computed pollution pattern with a plurality of pollution patterns associated with the plurality of the data chips; and if one of the plurality of the pollution patterns associated with the plurality of the data chips is within a threshold of the computed pollution pattern, identifying the pollution pattern that is within a threshold of the computed pollution pattern.

Statement 80. An embodiment of the inventive concept includes an article according to statement 79, wherein comparing the computed pollution pattern with a plurality of pollution patterns associated with the plurality of the data chips includes identifying the one of the plurality of the pollution patterns associated with the plurality of the data chips that is closest to the computed pollution pattern.

Statement 81. An embodiment of the inventive concept includes an article according to statement 80, wherein identifying the one of the plurality of the pollution patterns associated with the plurality of the data chips that is closest to the computed pollution pattern includes identifying the one of the plurality of the pollution patterns associated with the plurality of the data chips that has the most bits that match bits in the computed pollution pattern.

Statement 82. An embodiment of the inventive concept includes an article according to statement 79, wherein the threshold is one half of a size of the computed pollution pattern.

Statement 83. An embodiment of the inventive concept includes an article according to statement 79, wherein if none of the plurality of the pollution patterns associated with the plurality of the data chips is within the threshold of the computed pollution pattern, not identifying any pollution pattern associated with the plurality of the data chips.

Statement 84. An embodiment of the inventive concept includes an article according to statement 83, the tangible storage medium having stored thereon further non-transitory instructions that, when executed by the machine, result in logging the error as an uncorrectable error (UE).

Statement 85. An embodiment of the inventive concept includes an article according to statement 79, the tangible storage medium having stored thereon further non-transitory instructions that, when executed by the machine, result in:

sending the identified at least one of the plurality of the data chips that has the error a Memory Controller Disable signal; and receiving a raw data from the identified at least one of the plurality of the data chips that has the error.

Statement 86. An embodiment of the inventive concept includes an article according to statement 79, wherein correcting the error in the original data from the plurality of the data chips responsive to the pollution pattern and the original data from the plurality of the data chips includes:

discarding the original data from the identified at least one of the plurality of the data chips that has the error; and recreating the data from the identified at least one of the plurality of the data chips that has the error using the original data from the others of the plurality of the data chips.

Statement 87. An embodiment of the inventive concept includes an article according to statement 86, wherein recreating the data from the identified at least one of the plurality of the data chips that has the error using the original data from the others of the plurality of the data chips includes:

calculating a parity for the original data from the others of the plurality of the data chips; and using the calculated parity as the data from the identified at least one of the plurality of the data chips that has the error.

Statement 88. An embodiment of the inventive concept includes an article according to statement 79, wherein correcting the error in the original data from the plurality of the data chips responsive to the pollution pattern and the original data from the plurality of the data chips includes:

removing the identified pollution pattern from the original data from the identified at least one of the plurality of the data chips that has the error, producing unpolluted data; and correcting the error in the unpolluted data from the identified at least one of the plurality of the data chips that has the error using the unpolluted data from the identified at least one of the plurality of the data chips that has the error and the original data from the others of the plurality of the data chips.

Statement 89. An embodiment of the inventive concept includes an article according to statement 88, wherein removing the identified pollution pattern from the original data from the identified at least one of the plurality of the data chips that has the error, producing unpolluted data includes XORing the identified pollution pattern with the original data from the identified at least one of the plurality of the data chips that has the error.

Statement 90. An embodiment of the inventive concept includes an article according to statement 88, wherein correcting the error in the unpolluted data from the identified at least one of the plurality of the data chips that has the error using the unpolluted data from the identified at least one of the plurality of the data chips that has the error and the original data from the others of the plurality of the data chips includes:

calculating a parity for the unpolluted data from the identified at least one of the plurality of the data chips that has the error and the original data from the others of the plurality of the data chips; and reversing at least one bit in the unpolluted data from the identified at least one of the plurality of the data chips that has the error based on the calculated parity.

Statement 91. An embodiment of the inventive concept includes an article according to statement 74, the tangible storage medium having stored thereon further non-transitory instructions that, when executed by the machine, result in selecting a plurality of pollution patterns for the plurality of the data chips during boot up.

Statement 92. An embodiment of the inventive concept includes an article according to statement 91, wherein selecting a plurality of pollution patterns for the plurality of the data chips includes programming the plurality of the data chips with the plurality of pollution patterns during the boot up.

Statement 93. An embodiment of the inventive concept includes an article according to statement 91, wherein selecting a plurality of pollution patterns for the plurality of the data chips includes:

selecting a plurality of identifiers of pre-programmed pollution patterns for the plurality of the data chips during the boot up; and programming the plurality of the data chips with the selected plurality of identifiers during the boot up.

Consequently, in view of the wide variety of permutations to the embodiments described herein, this detailed description and accompanying material is intended to be illustrative only, and should not be taken as limiting the scope of the inventive concept. What is claimed as the inventive concept, therefore, is all such modifications as may come within the scope and spirit of the following claims and equivalents thereto.

What is claimed is:

1. A memory controller, comprising:
   read circuitry to request an original data at an address stored in at least two data chips;
   parity circuitry to calculate a parity from the original data received from the at least two data chips;
   pollution pattern analysis circuitry to compare the parity with at least two pollution patterns programmed into the at least two data chips to identify a data chip with an error, wherein the original data returned from the identified data chip with the error is polluted using one of the at least two pollution patterns; and
   error correction circuitry to correct the error in the original data received from the identified data chip with the error.

2. The memory controller according to claim 1, wherein the at least two data chips are included in a Dynamic Random Access Memory (DRAM) module.

3. The memory controller according to claim 1, wherein the pollution pattern analysis circuitry and the error correction circuitry are utilized only based at least in part on the parity circuitry indicating that there is an error in the original data received from the at least two data chips.

4. The memory controller according to claim 3, wherein the calculated parity from the original data received from the at least two data chips indicates that there is an error in the original data received from the at least two data chips.

5. The memory controller according to claim 1, wherein the pollution pattern analysis circuitry is operative to identify one of the at least two pollution patterns programmed into the at least two data chips that is closest to the parity.

6. The memory controller according to claim 5, wherein the pollution pattern analysis circuitry is further operative to determine that the identified one of the pollution patterns programmed into the at least two data chips is within a threshold of the parity.

7. The memory controller according to claim 6, wherein the threshold is one half of a size of the parity.

8. The memory controller according to claim 6, wherein the pollution pattern analysis circuitry is further operative to not identify any of the pollution patterns programmed into the at least two data chips based at least in part on none of the pollution patterns programmed into the at least two data chips being within the threshold of the parity.

9. The memory controller according to claim 8, further comprising a log to log that none of the pollution patterns programmed into the at least two data chips is within the threshold of the parity.

10. The memory controller according to claim 5, wherein the pollution pattern analysis circuitry is operative to identify the one of the at least two pollution patterns programmed into the at least two data chips that has the most bits that match bits in the parity.

11. The memory controller according to claim 5, wherein the pollution pattern analysis circuitry is operative to identify one of the at least two data chips associated with the identified one of the at least two pollution patterns programmed into the at least two data chips as the identified data chip with the error.

12. The memory controller according to claim 5, wherein:
    the memory controller is operative to send the identified data chip with the error a Memory Controller Disable signal; and
    the read circuitry is operative to receive a raw data from the identified data chip with the error.

13. The memory controller according to claim 1, wherein the error correction circuitry is operative to recreate the data from the identified data chip with the error using the original data from the others of the at least two data chips.

14. The memory controller according to claim 13, wherein the parity circuitry is operative to recreate the data from the identified data chip with the error by calculating a parity for the original data from others of the at least two data chips.

15. The memory controller according to claim 1, wherein the error correction circuitry is operative to remove the parity from the original data received from the identified data chip with the error and to correct an error in an unpolluted data from the identified data chip with the error using the unpolluted data from the identified data chip with the error and the original data from others of the at least two data chips.

16. The memory controller according to claim 15, wherein the error correction circuitry is further operative to calculate a parity for the unpolluted data from the identified data chip with the error and the original data from others of the at least two data chips and to reverse at least one bit in the unpolluted data from the identified data chip with the error based on the calculated parity.

17. The memory controller according to claim 1, further comprising pollution pattern programming circuitry to select at least two pollution patterns for the at least two data chips during boot up.

18. The memory controller according to claim 17, wherein the pollution patterns are all unique.

19. The memory controller according to claim 17, wherein the pollution pattern programming circuitry is operative to program the at least two data chips with the at least two pollution patterns during the boot up.

20. The memory controller according to claim 17, wherein the pollution pattern programming circuitry is operative to select at least two identifiers of pre-programmed pollution patterns for the at least two data chips during the boot up and to program the at least two data chips with the selected at least two identifiers during the boot up.

21. The memory controller according to claim 1, wherein the identified data chip with the error is unable to correct the error internally.

\* \* \* \* \*